(12) United States Patent
Lee et al.

(10) Patent No.: US 11,361,706 B2
(45) Date of Patent: Jun. 14, 2022

(54) MICRO-LED DISPLAY SYSTEM

(71) Applicant: Raydium Semiconductor Corporation, Hsinchu (TW)

(72) Inventors: Kuan-Hsien Lee, Chiayi County (TW); Chien-Yu Chan, Zhubei (TW); Yann-Hsiung Liang, Taichung (TW); Yu-Lung Lo, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 17/144,235

(22) Filed: Jan. 8, 2021

(65) Prior Publication Data
US 2021/0217354 A1   Jul. 15, 2021

Related U.S. Application Data

(60) Provisional application No. 62/959,347, filed on Jan. 10, 2020.

(51) Int. Cl.
*G09G 3/32* (2016.01)
*H01L 27/15* (2006.01)

(52) U.S. Cl.
CPC ............. *G09G 3/32* (2013.01); *H01L 27/156* (2013.01); *G09G 2300/0857* (2013.01); *G09G 2310/027* (2013.01)

(58) Field of Classification Search
CPC .................... G09G 3/32; G09G 2310/0286
See application file for complete search history.

(56) References Cited

U.S. PATENT DOCUMENTS

| | | | |
|---|---|---|---|
| 2017/0061867 A1* | 3/2017 | Cok | F21K 9/90 |
| 2021/0217354 A1* | 7/2021 | Lee | H01L 25/167 |

\* cited by examiner

*Primary Examiner* — Sanjiv D. Patel

(57) ABSTRACT

A micro-LED display system is disclosed. The micro-LED display system includes a host, a plurality of row/column drivers and a plurality of μICs. The row/column drivers are coupled to the host through serial interfaces and used to provide a plurality of row clock signals and a plurality of column data signals respectively. The μICs are arranged as a matrix including columns of μICs and rows of μICs receiving the column data signals and the row clock signals respectively. All μICs in the same column of μICs are cascaded in order and all μICs in the same row of μICs are cascaded in order.

19 Claims, 29 Drawing Sheets

MICRO-LED DISPLAY SYSTEM

BACKGROUND OF THE INVENTION

1. Field of the Invention

The invention relates to a display; in particular, to a Micro-LED display system.

2. Description of the Prior Art

As shown in FIG. 1A and FIG. 1B, the conventional micro-LED display system 1 includes a host 10, a first row/column driver 121 to a k-th row/column driver 12k, and (k*m*n) Micro-LED integrated circuits μICs, where k, m, and n are all positive integers.

The host 10 is respectively coupled to the first row/column driver 121 to the k-th row/column driver 12k through a serial interface. The (k*m*n) micro-LED integrated circuit μICs are arranged in the form of k matrixes of (m*n) μICs. The first row/column driver 121 to the k-th row/column driver 12k are respectively used for coupling and driving the k matrixes of (m*n) μICs.

Taking the first row/column driver 121 as an example, the first row/column driver 121 respectively outputs n column data signals COL1~COLn and m row clock signals ROW1~ROWm to the corresponding first matrix of (m*n) μICs. The first matrix of (m*n) μICs includes n columns of μICs and m rows of μICs. The n column data signals COL1~COLn outputted by the first row/column driver 121 are respectively sent to the n columns of μICs. The m row clock signals ROW1~ROWm outputted by the first row/column driver 121 are respectively transmitted to the m rows of μICs.

As for the second row/column driver 122 to the kth row/column driver 12k respectively output n column data signals COL1~COLn and m row clock signals ROW1~ROWm to the corresponding second matrix of (m*n) μICs to the k-th matrix of (m*n) μICs can also be deduced by analogy, which will not be repeated here.

Next, please refer to FIG. 2. FIG. 2 illustrates an enlarged schematic diagram of the portion in the dashed frame in FIG. 1B. As shown in FIG. 2, the μIC at the upper left is respectively coupled to the wires that transmit the column data signal COL1 and the row clock signal ROW1, and the red, green, and blue micro-light-emitting diodes LEDs are coupled between the working voltage VDD and the μIC.

Similarly, the μIC at the bottom left is respectively coupled to the wires that transmit the column data signal COL1 and the row clock signal ROW2, and the red, green, and blue micro-light-emitting diodes LEDs are coupled between the working voltage VDD and the μIC. The μIC at the upper right is respectively coupled to the wires that transmit the column data signal COL2 and the row clock signal ROW1, and the red, green, and blue micro-light-emitting diodes LEDs are coupled between the working voltage VDD and the μIC. The μIC at the bottom right is respectively coupled to the wires that transmit the column data signal COL2 and the row clock signal ROW2, and the red, green, and blue micro-light-emitting diodes LEDs are coupled between the working voltage VDD and the μIC. As for the remaining μICs in FIG. 1B, the analogy can also be applied, and will not be repeated here.

Next, please refer to FIG. 3 and FIG. 4. FIG. 3 and FIG. 4 respectively illustrate the functional block diagram of the conventional μIC and the timing diagram of the received column data signal CD and row clock signal RC.

As shown in FIG. 3, the input terminal D of the D-type flip-flop DFF1 receives the column data signal CD, and the output terminal Q of the D-type flip-flop DFF1 is coupled to the input terminal D of the D-type flip-flop DFF2 and outputs a control signal DR. The output terminal Q of the D-type flip-flop DFF2 is coupled to the input terminal D of the D-type flip-flop DFF3 and outputs a control signal DG. The output terminal Q of the D-type flip-flop DFF3 outputs the control signal DB. The input terminals CKs of the D-type flip-flops DFF1~DFF3 all receive the row clock signal RC.

The transistors M1~M2 are coupled in series between the red micro-LED R and the ground terminal GND, wherein the transistor M1 is controlled by the control signal DR and the transistor M2 is controlled by the bias voltage VBS. The transistors M3~M4 are coupled in series between the green micro-LED G and the ground terminal GND, wherein the transistor M3 is controlled by the control signal DG and the transistor M4 is controlled by the bias voltage VBS. The transistors M5~M6 are coupled in series between the blue micro-LED B and the ground terminal GND, wherein the transistor M5 is controlled by the control signal DB and the transistor M6 is controlled by the bias voltage VBS.

As shown in FIG. 4, the column data signal CD and the row clock signal RC are both pulse signals. The pulse width of the column data signal CD is greater than the pulse width of the row clock signal RC. The rising edge of the column data signal CD is earlier than the rising edge of the row clock signal RC, and the falling edge of the column data signal CD and the falling edge of the row clock signal RC are synchronized with each other, so data latch can be achieved.

However, the conventional μIC still has many shortcomings/problems in practical applications, such as: (1) high power consumption; (2) low frame rate; (3) low pixel resolution; (4) difficult to reduce the number of pins required; and (5) difficult to reduce the number of row/column drivers required, urgently need to be further overcome.

SUMMARY OF THE INVENTION

Therefore, the invention provides a Micro-LED display system to effectively solve the above-mentioned problems in the prior art.

An embodiment of the invention is a Micro-LED display system. In this embodiment, the micro-LED display system includes a host, a plurality of row/column drivers and a plurality of micro-LED integrated circuits (μICs). The plurality of row/column drivers is coupled to the host through serial interfaces and configured to provide a plurality of row clock signals and a plurality of column data signals respectively. The plurality of micro-LED integrated circuits (μICs) is arranged as a matrix including a plurality of columns of μICs and a plurality of rows of μICs, the plurality of columns of μICs receiving the plurality of column data signals respectively and the plurality of rows of μICs receiving the plurality of row clock signals respectively, wherein all μICs in the same column are cascaded in order and all μICs in the same row are cascaded in order.

In an embodiment of the invention, the μIC receives the column data signal, the row clock signal and a LED enable signal respectively. The μIC includes a first D-type flip-flop to a fifth D-type flip-flop, a first ADD gate to a third ADD gate and a first transistor to a sixth transistor. An input terminal of the first D-type flip-flop receives the column data signal and its output terminal is coupled to an input terminal of the second D-type flip-flop, and an output terminal of the second D-type flip-flop is coupled to an input terminal of the third D-type flip-flop, an output terminal of the third D-type flip-flop is coupled to an input terminal of the fourth D-type flip-flop, the other input terminals of the first D-type flip-flop to the fourth D-type flip-flop receive the row clock signal, an input terminal of the fifth D-type flip-flop receives the LED enable signal and the other input terminal of the fifth D-type flip-flop is coupled to an output terminal of the fourth D-type flip-flop, an output terminal of the fifth D-type flip-flop is coupled to a bias voltage, an input terminal of the first AND gate receives the LED enable signal and the other input terminal of the first AND gate is coupled between the first D-type flip-flop and the second D-type flip-flop, an input terminal of the second AND gate receives the LED enable signal and the other input terminal of the second AND gate is coupled between the second D-type flip-flop and the third D-type flip-flop, an input terminal of the third AND gate receives the LED enable signal and the other input terminal of the third AND gate is coupled between the third D-type flip-flop and the fourth D-type flip-flop, the output terminals of the first AND gate to the third AND gate output a first control signal, a second control signal and a third control signal respectively, the first transistor and the second transistor are coupled in series between a red micro-LED and a ground terminal, the first transistor is controlled by the first control signal and the second transistor is controlled by the bias voltage, the third transistor and the fourth transistor are coupled in series between a green micro-LED and the ground terminal, the third transistor is controlled by the second control signal and the fourth transistor is controlled by the bias voltage, the fifth transistor and the sixth transistor are coupled in series between a blue micro-LED and the ground terminal, and the fifth transistor is controlled by the third control signal and the sixth transistor is controlled by the bias voltage.

In an embodiment of the invention, the LED enable signal has an LED turn-on enable period, a pulse width of the column data signal is greater than a pulse width of the row clock signal, a rising edge of the column data signal is earlier than a rising edge of the row clock signal, and a falling edge of the column data signal and a falling edge of the row clock signal are synchronized with each other.

In an embodiment of the invention, the μIC receives the column data signal and the row clock signal respectively. the μIC includes a first D-type flip-flop to a fifth D-type flip-flop, a first ADD gate to a third ADD gate, a LED enabling unit and a first transistor to a sixth transistor. An input terminal of the first D-type flip-flop receives the column data signal and its output terminal is coupled to an input terminal of the second D-type flip-flop, and an output terminal of the second D-type flip-flop is coupled to an input terminal of the third D-type flip-flop, an output terminal of the third D-type flip-flop is coupled to an input terminal of the fourth D-type flip-flop, the other input terminals of the first D-type flip-flop to the fourth D-type flip-flop receive the row clock signal, and an input terminal of the fifth D-type flip-flop is coupled to the LED turn-on enabling unit and receives an enable signal, the other input terminal of the fifth D-type flip-flop is coupled to an output terminal of the fourth D-type flip-flop, an output terminal of the fifth D-type flip-flop is coupled to a bias voltage, and an input terminal of the first AND gate is coupled to the LED turn on enabling unit and receives the enable signal, and its other input terminal is coupled between the first D-type flip-flop and the second D-type flip-flop, and an input terminal of the second AND gate is coupled to the LED turn on enabling unit and receives the enable signal, and its other input terminal is coupled between the second D-type flip-flop and the third D-type flip-flop, an input terminal of the third AND gate is coupled to the LED turn-on enabling unit and receives the enable signal, and its other input terminal is coupled between the third D-type flip-flop and the fourth D-type flip-flop, output terminals of the first AND gate to the third AND gate output a first control signal, a second control signal and a third control signal respectively, the first transistor and the second transistor are coupled in series between a red micro-LED and a ground terminal, the first transistor is controlled by the first control signal and the second transistor is controlled by the bias voltage, and the third transistor and the fourth transistor are coupled in series between a green micro-LED and the ground terminal, the third transistor is controlled by the second control signal and the fourth transistor is controlled by the bias voltage, the fifth transistor and the sixth transistor are coupled in series between a blue micro-LED and the ground terminal, the fifth transistor is controlled by the third control signal and the sixth transistor is controlled by the bias voltage.

In an embodiment of the invention, a pulse width of the column data signal is greater than a pulse width of the row clock signal, a rising edge of the column data signal is earlier than a rising edge of the row clock signal, and a falling edge of the column data signal and a falling edge of the row clock signal are synchronized with each other, the row clock signal is embedded with an LED turn-on enable period.

In an embodiment of the invention, the μIC receives the column data signal and the row clock signal respectively. The μIC includes a first D-type flip-flop to a fifth D-type flip-flop, a first ADD gate to a third ADD gate, a LED turn on enabling and DFF reset unit and a first transistor to a sixth transistor. An input terminal of the first D-type flip-flop receives the column data signal and its output terminal is coupled to an input terminal of the second D-type flip-flop, and an output terminal of the second D-type flip-flop is coupled to an input terminal of the third D-type flip-flop, an output terminal of the third D-type flip-flop is coupled to an input terminal of the fourth D-type flip-flop, the LED turn on enabling and DFF reset unit and the other input terminals of the first D-type flip-flop to the fourth D-type flip-flop all receive the row clock signal, and an input terminal of the fifth D-type flip-flop is coupled to the LED turn on enabling and DFF reset unit to receive an enable signal and the other input terminal of the fifth D-type flip-flop is coupled to an output terminal of the fourth D-type flip-flop, and an output terminal of the fifth D-type flip-flop is coupled to a bias voltage, an input terminal of the first AND gate is coupled to the LED turn on enabling and DFF reset unit to receive the enable signal, and the other input terminal of the first AND gate is coupled between the first D-type flip-flop and the second D-type flip-flop, an input terminal of the second AND gate is coupled to the LED turn on enabling and DFF reset unit to receive the enable signal, and the other input terminal of the second AND gate is coupled between the second D-type flip-flop and the third D-type flip-flop, an input terminal of the third AND gate is coupled to the LED turn on enabling and DFF reset unit to receive the enable signal and the other input terminal of the third AND gate is coupled between the third D-type flip-flop and the fourth D-type flip-flop, output terminals of the first AND gate to the third AND gate output a first control signal, a second control signal and a third control signal respectively, the LED turn on enabling and DFF reset unit is respectively coupled to and provides a reset signal to the other input terminals of the first D-type flip-flop to the fourth D-type flip-flop, the first transistor and the second transistor are coupled in series between a red micro-LED and a ground terminal, the first transistor is controlled by the first control signal and the second transistor is controlled by the bias voltage, the third transistor and the fourth transistor are coupled in series between a green micro-LED and the ground terminal, and the third transistor is controlled by the second control signal and the fourth transistor is controlled by the bias voltage, the fifth transistor and the sixth transistor are coupled in series between a blue micro-LED and the ground terminal, the fifth transistor is controlled by the third control signal and the sixth transistor is controlled by the bias voltage.

In an embodiment of the invention, a pulse width of the column data signal is greater than a pulse width of the row clock signal, a rising edge of the column data signal is earlier than a rising edge of the row clock signal, and a falling edge of the column data signal and a falling edge of the row clock signal are synchronized with each other, and the row clock signal is also embedded with an LED turn-on enable period, a falling edge of the reset signal is synchronized with a rising edge of the row clock signal and a rising edge of the reset signal is synchronized with an end time of the LED turn-on enable period and a falling edge of the enable signal.

In an embodiment of the invention, the μIC receives the column data signal, the row clock signal, a latch enable signal, and an output reset signal respectively, the μIC includes a first D-type flip-flop to an eighth D-type flip-flop and a first ADD gate to a third ADD gate, an input terminal of the first D-type flip-flop receives the column data signal and its output terminal is coupled to an input terminal of the second D-type flip-flop, an output terminal of the second D-type flip-flop is coupled to an input terminal of the third D-type flip-flop, and an output terminal of the third D-type flip-flop is coupled to an input terminal of the fourth D-type flip-flop, other input terminals of the first D-type flip-flop to the fourth D-type flip-flop all receive the row clock signal, an input terminal of the fifth D-type flip-flop receives the latch enable signal and the other input terminal of the fifth D-type flip-flop is coupled between the first D-type flip-flop and the second D-type flip-flop, an input terminal of the sixth D-type flip-flop receives the latch enable signal and the other input terminal of the sixth D-type flip-flop is coupled between the second D-type flip-flop and the third D-type flip-flop, an input terminal of the seventh D-type flip-flop receives the latch enable signal and the other input terminal of the seventh D-type flip-flop is coupled between the third D-type flip-flop and the fourth D-type flip-flop, an input terminal of the eighth D-type flip-flop receives the latch enable signal and the other input terminal of the eighth D-type flip-flop is coupled to an output terminal of the fourth D-type flip-flop, an input terminal of the first ADD gate receives the output reset signal and the other input terminal of the first ADD gate is coupled to an output terminal of the fifth D-type flip-flop, an input terminal of the second ADD gate receives the output reset signal and the other input terminal of the second ADD gate is coupled to an output terminal of the sixth D-type flip-flop, an input terminal of the third ADD gate receives the output reset signal and the other input terminal of the third ADD gate is coupled to an output terminal of the seventh D-type flip-flop, output terminals of the first ADD gate to the third ADD gate output a first control signal, a second control signal and a third control signal respectively, and an output terminal of the eighth D-type flip-flop outputs a fourth control signal.

In an embodiment of the invention, when the μIC is operated in an all-on mode, the latch enable signal changes from low-level to high-level at a time when the column data signal enters a blanking interval, and then both the row clock signal and the latch enable signal maintain high-level until the row data signal ends at another time when the blanking interval is synchronized from high-level to low-level, and a rising edge of the output reset signal and a rising edge of the row clock signal are synchronized and maintained at high-level, and a start time and an end time of a sub-frame are synchronized with a rising edge of the latch enable signal.

In an embodiment of the invention, when the μIC is operated in a pulse-width modulation (PWM) mode, the latch enable signal changes from low-level to high-level at a time when the column data signal enters a blanking interval, and the row clock signal and the latch enable signal are synchronously changed from high-level to low-level at another time in the blanking interval of the column data signal, and a rising edge of the output reset signal and a rising edge of the row clock signal are synchronized and maintained at high-level, and the output reset signal becomes low-level at another time in the blanking interval of the column data signal, and a start time and an end time of a sub-frame are both synchronized with a rising edge of the latch enable signal.

In an embodiment of the invention, the micro-LED display system further includes a pulse filter, the pulse filter includes a NOT gate, a current source and a transistor, the current source and the transistor are coupled in series with each other and the NOT gate is coupled to a gate of the transistor, the NOT gate is coupled to the row clock signal and a DFF reset signal or an enable signal is coupled between the current source and the transistor to filter the DFF reset signal or the enable signal.

In an embodiment of the invention, for a bit, the plurality of column data signals is the same to sequentially transmit different data pulses at the same time, while the plurality of row clock signals is different to sequentially transmit clock pulses at different times.

In an embodiment of the invention, the row/column driver includes a row driver, a column driver, a word line decoder, a frame buffer, a clock buffer, a data arranging unit, a serial protocol interface, a protocol decoder and a register, the protocol decoder is coupled between the serial protocol interface and the register, the data arranging unit is coupled between the protocol decoder and the frame buffer, and the word line decoder is coupled among the clock buffer, the row driver and the frame buffer, the frame buffer is coupled among the word line decoder, the data arranging unit and the row driver, the serial protocol interface receives a serial clock signal and a serial data and control signal respectively, the clock buffer receives the serial clock signal and converts the serial clock signal into a gray-scale clock signal and outputs the gray-scale clock signal to the word line decoder, the row driver outputs the plurality of row clock signals and the column driver outputs the plurality of column data signals respectively.

In an embodiment of the invention, the row/column driver includes a row driver, a column driver, a word line decoder, a frame buffer, a phase-locked loop, a data arranging unit, a serial protocol interface, a protocol decoder and a register, the protocol decoder is coupled between the serial protocol interface and the register, the data arranging unit is coupled between the protocol decoder and the frame buffer, and the word line decoder is coupled among the phase-locked loop, the row driver and the frame buffer, the frame buffer is coupled among the word line decoder, the data arranging unit and the row driver, the serial protocol interface receives a serial clock signal and a serial data and control signal respectively, the phase-locked loop receives the serial clock signal and converts the serial clock signal into a gray-scale clock signal and outputs the gray-scale clock signal to the word line decoder, the row driver outputs the plurality of row clock signals and the column driver outputs the plurality of column data signals respectively.

In an embodiment of the invention, the row/column driver includes a row driver, a column driver, a word line decoder, a frame buffer, an oscillator and one-time programmable, a data arranging unit, a serial protocol interface, a protocol decoder and a register, the protocol decoder is coupled between the serial protocol interface and the register, the data arranging unit is coupled between the protocol decoder and the frame buffer, and the word line decoder is coupled among the oscillator and one-time programmable, the row driver and the frame buffer, the frame buffer is coupled among the word line decoder, the data arranging unit and the row driver, the serial protocol interface receives a serial clock signal and a serial data and control signal respectively, the oscillator and one-time programmable receives the serial clock signal and converts the serial clock signal into a gray-scale clock signal and outputs the gray-scale clock signal to the word line decoder, the row driver outputs the plurality of row clock signals and the column driver outputs the plurality of column data signals respectively.

In an embodiment of the invention, the row/column driver also includes a data correction and mapping unit, the data correction and mapping unit is coupled between the protocol decoder and the data arranging unit and configured to perform data correction and mapping process before data arrangement.

In an embodiment of the invention, if a binary PWM method is adopted, a p-th frame of n-bits includes n sub-frames in order, which are a (n–1)-th sub-frame and a (n–2)-th sub-frame, . . . , a first frame and a zeroth frame, the (n–1)-th subframe has a most significant bit and the zeroth frame has a least significant bit, for each of the plurality of row clock signals, if an enable time length that it corresponds to the zeroth frame is T, then an enable time length that it corresponds to the (n–1)-th frame is $(2^{n-1}*T)$, an enable time length that it corresponds to the (n–2)-th frame is $(2^{n-2}*T)$, . . . and an enable time length that it corresponds to the first frame is $(2*T)$, where n and p are both positive integers, and an enable time length that it corresponds to each frame can include the same enable time offset or different enable time offsets.

In an embodiment of the invention, if a distributed PWM method is adopted, a p-th frame of n-bits includes (2n–1) sub-frames, which are sequentially a first frame, a second frame, . . . , a $(2^{n-1})$-th sub-frame and a $(2^{n-1})$-th sub-frame, for each of the plurality of row clock signals, an enable time length that it corresponds to each frame can be the same or different and the enable time length that it corresponds to each frame can includes the same enable time offset or different enable time offsets.

In an embodiment of the invention, if a p-th frame includes (X+Y) bits, X and Y are both positive integers, and when a distributed and binary mixed PWM method is adopted for the p-th frame, a distributed PWM method is adopted for X bits in the (X+Y) bits of the p-th frame and a binary PWM method is adopted for Y bits in the (X+Y) bits of the p-th frame, then the p-th frame includes $(2^X-1)$ sub-frames corresponding to the X bits and Y sub-frames corresponding to the Y bits, for each of the plurality of row clock signals, enable time lengths it corresponds to the $(2^X-1)$ sub-frames using the distributed PWM method are all $(2^Y*T)$ and enable time lengths it corresponds to the Y sub-frames using the binary PWM method are $(2^Y*T/2)$, . . . , $2^1*T$, $2^0*T$ respectively, for each of the plurality of row clock signals, each of the $(2^X-1)+Y$ sub-frames of the p-th frame can have the same enable time offset or different enable time offsets, and the Y sub-frames corresponding to the Y bits can be uniformly interlaced among the $(2^X-1)$ sub-frames corresponding to the X bits; when a separate distributed PWM method is adopted for the p-th frame, the separate distributed PWM method is separately adopted for the X bits and the Y bits of the (X+Y) bit respectively, then the p-th frame includes $(2^X-1)$ sub-frames corresponding to the X bits and $(2^Y-1)$ sub-frames corresponding to the Y bits, for each of the plurality of row clock signals, enable time lengths of the $(2^X-1)$ sub-frames are all $(2^Y*T)$ and enabling time lengths of the $(2^Y-1)$ sub-frames are all T, for each of the plurality of row clock signals, each of the $(2^X-1)+(2^Y-1)$ sub-frames of the p-th frame can have the same enable time offset or different enable time offsets, and the $(2^Y-1)$ sub-frames corresponding to the Y bits can be uniformly interlaced among the $(2^X-1)$ sub-frames corresponding to the X bits.

In an embodiment of the invention, since all μICs in the same column of μICs are cascaded in order, when one of the μICs in the same column of μICs receives a corresponding column data signal, the column data signal is forwarded to the next μIC in the same column of μICs and so on, and the column data signal is transmitted to the last μIC in the same column of μICs; since all μICs in the same row of μICs are cascaded in order, when one of the μICs in the same row of μICs receives a corresponding row clock signal, the row clock signal is forwarded to the next μIC in the same row of μICs and so on, and the row clock signal is transmitted to the last μIC in the same row of μICs, thereby reducing a number of the row/column drivers and a number of pins required for each μIC needed for the micro-LED display system.

Compared to the prior art, the Micro-LED IC (μIC) of the Micro-LED display system of the invention can achieve the following effects: (1) low speed and low power consumption; (2) high frame rate; (3) high pixel resolution; (4) reducing required number of pins; and (5) reducing required number of column/row drivers.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1A:
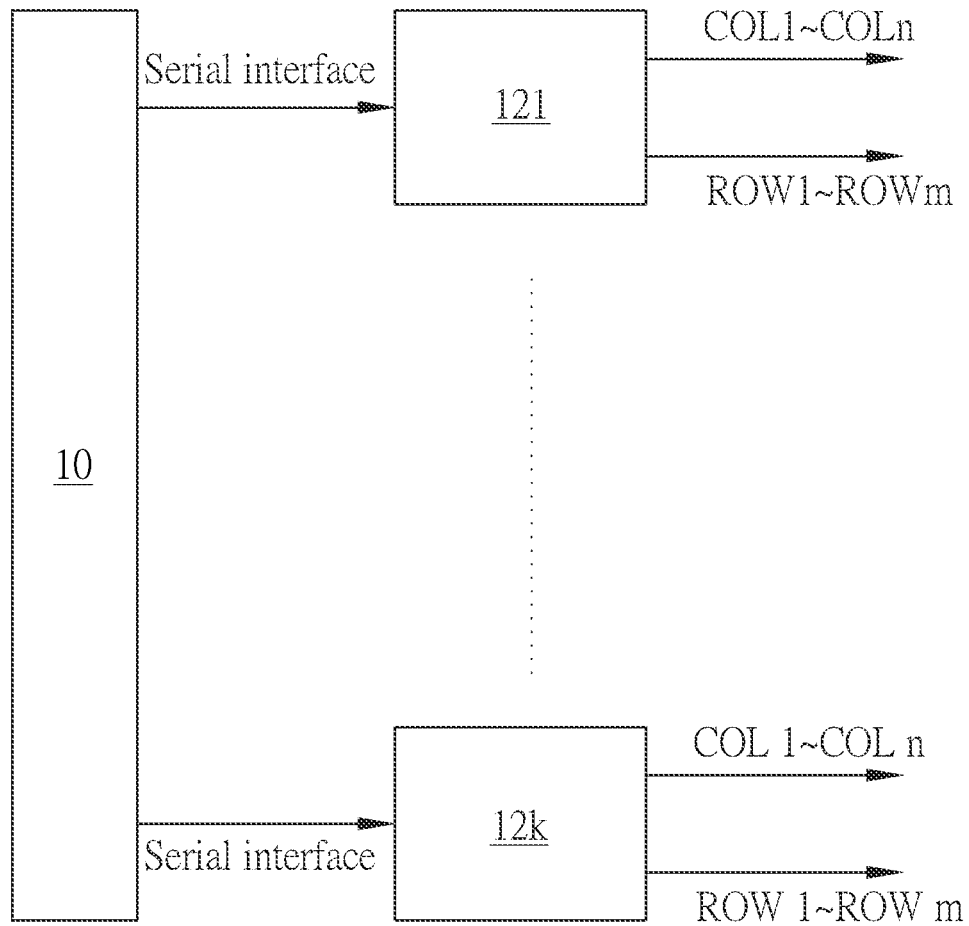
FIG. 1A and FIG. 1B illustrate schematic diagrams of a conventional micro-LED display system.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

Figure 1B:
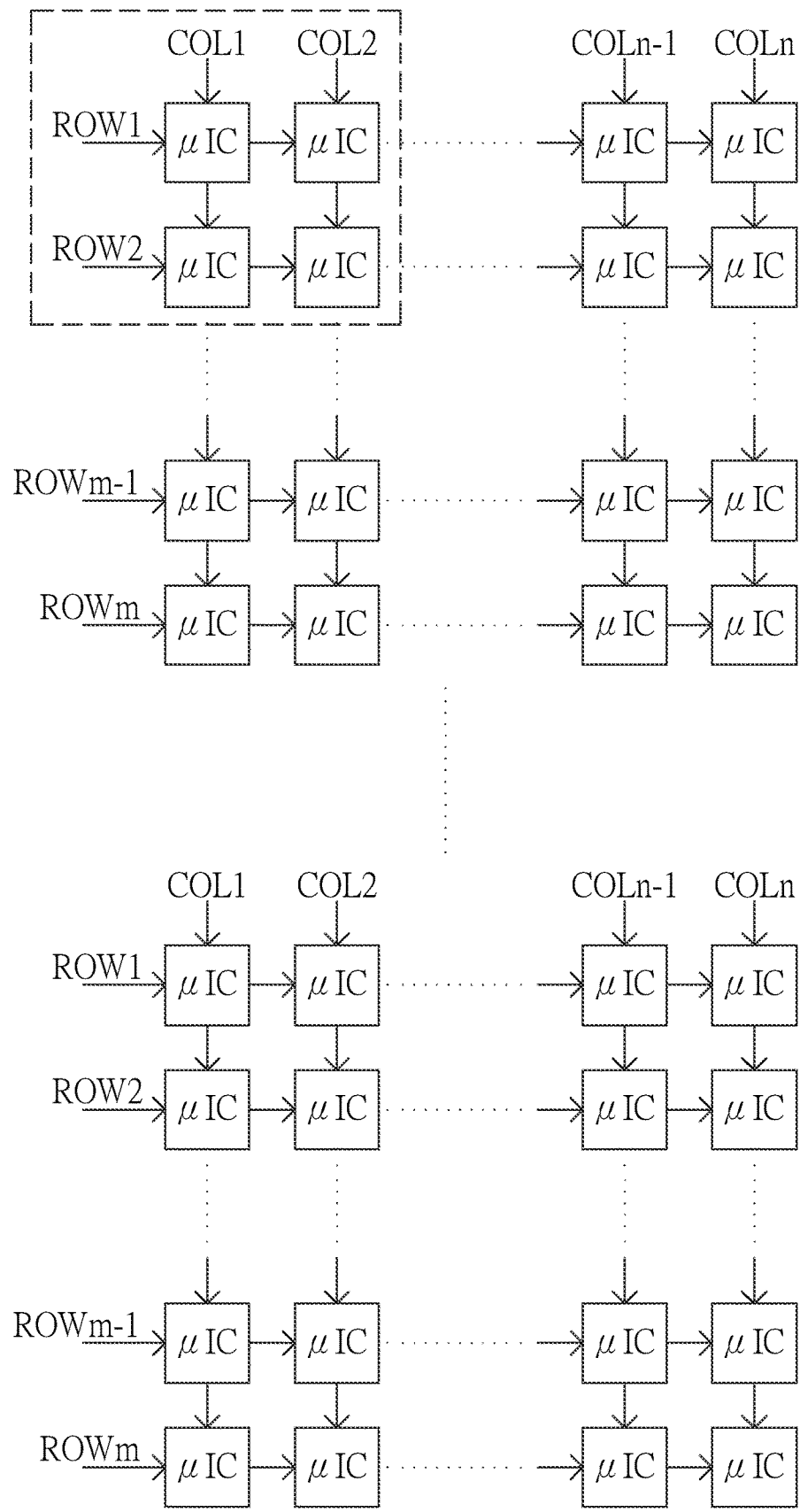

A specific embodiment according to the invention is a micro-LED display system, such as an active-matrix micro-LED display system, which includes a plurality of row/column drivers and a plurality of micro-LED ICs (μICs), but not limited to this. As for the overall structure, please refer to FIG. 1 and FIG. 2, which will not be repeated here.

Next, the micro-LED IC (μIC) in several different embodiments proposed by the invention will be described in detail.

Figure 5:
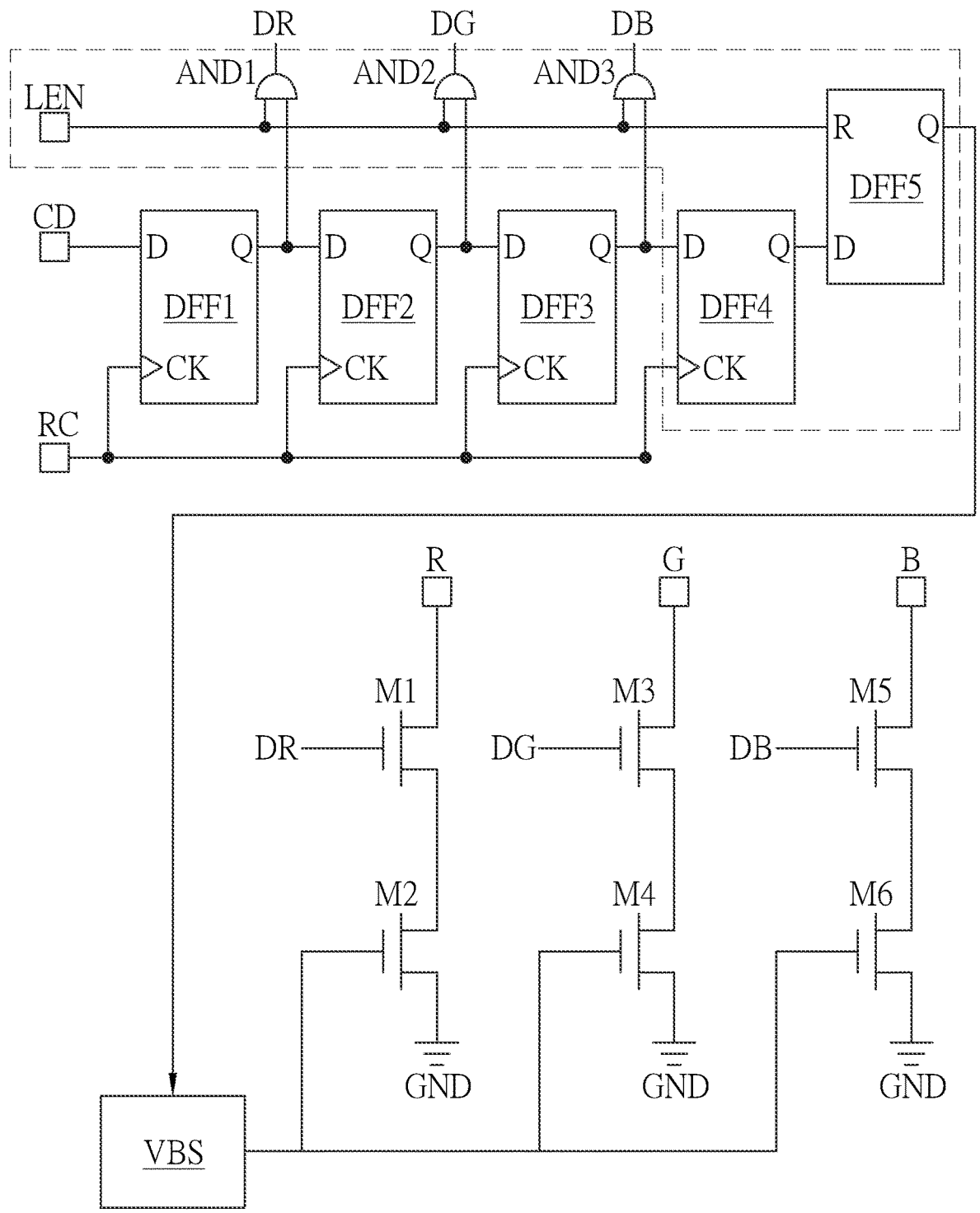
FIG. 5 and FIG. 6 illustrate the first embodiment of the μIC and its timing diagram in the invention respectively.

In the first embodiment, as shown in FIG. 5, the micro-LED integrated circuit μIC1 includes D-type flip-flops DFF1~DFF5, AND gates AND1~AND3, transistors M1~M6 and a bias voltage VBS. The μIC1 receives the column data signal CD, the row clock signal RC and the LED enable signal LEN respectively.

Figure 3:
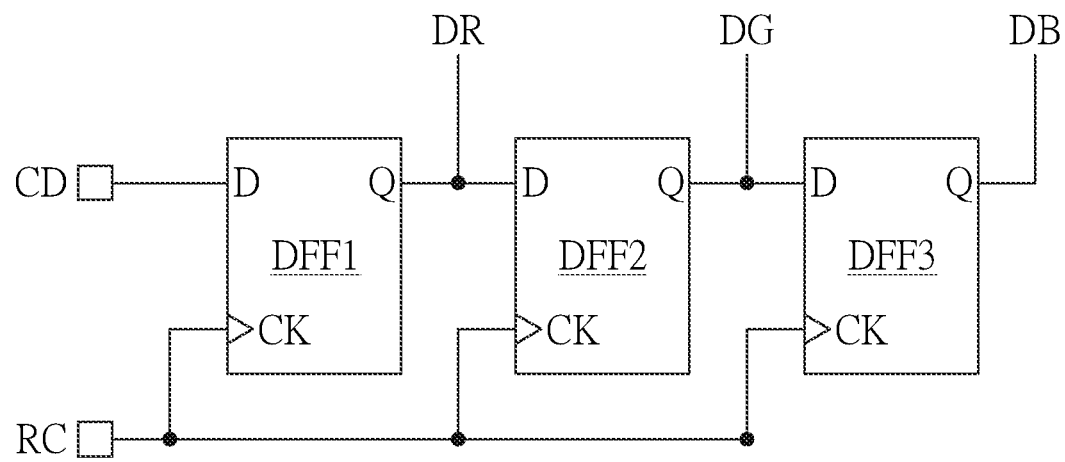
FIG. 3 and FIG. 4 illustrate a functional block diagram of a conventional μIC and a timing diagram of the column data signal and the row clock signal received respectively.
Figure 3:
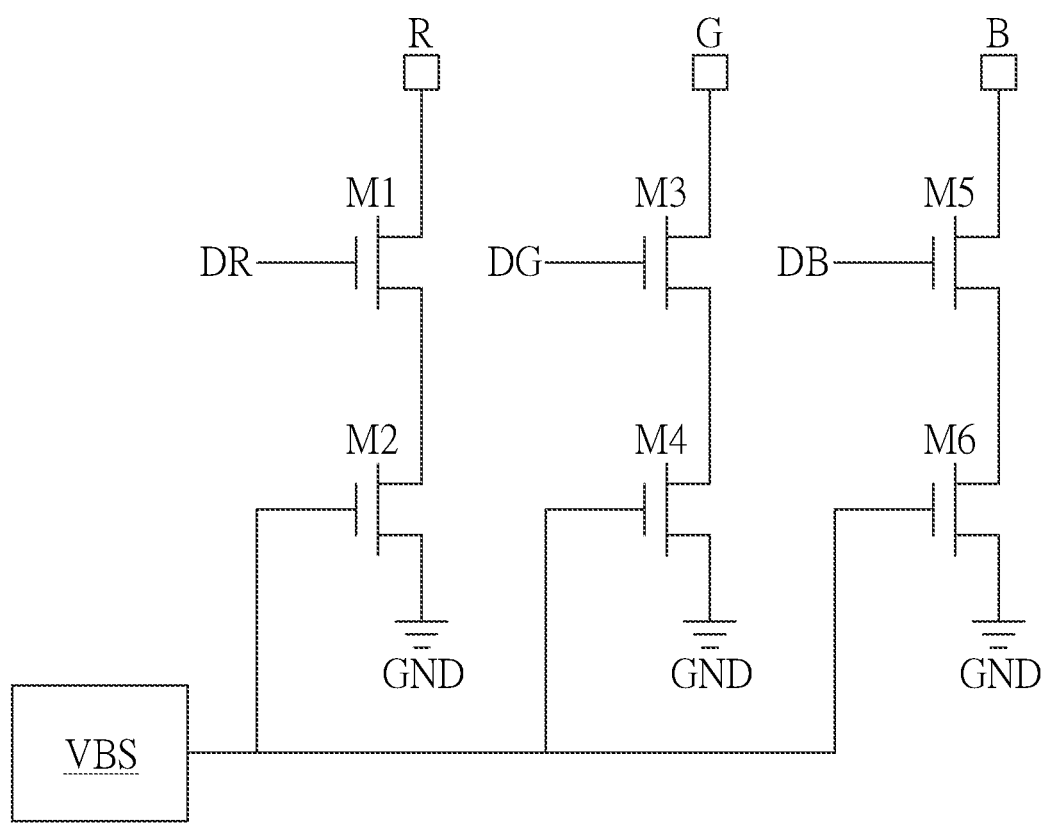
Figure 4:
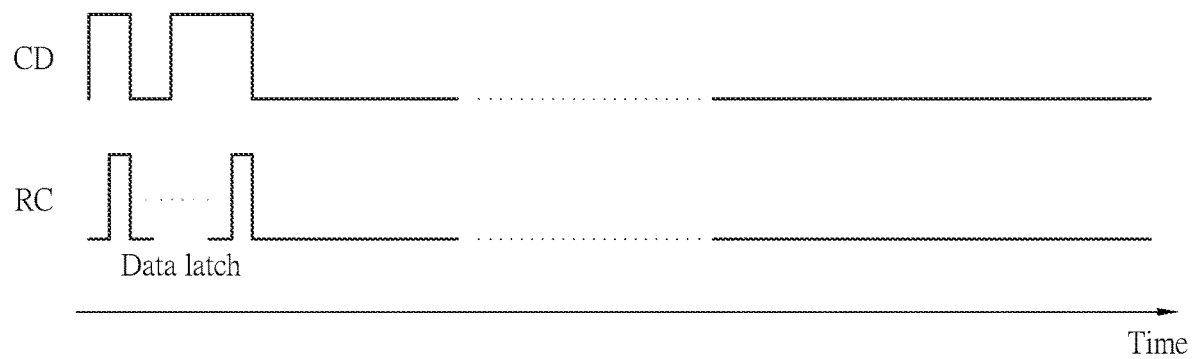

In other words, compared with the conventional μIC in FIG. 3, the μIC1 in FIG. 5 not only includes the D-type flip-flops DFF1~DFF3 and the transistors M1~M6, but also includes the AND gates AND1~AND3 and the D-type flip-flops DFF4~DFF5, and further receives the LED enable signal LEN, but not limited to this.

The input terminal D of the D-type flip-flop DFF1 receives the column data signal CD and the output terminal Q of the D-type flip-flop DFF1 is coupled to the input terminal D of the D-type flip-flop DFF2 and outputs a control signal DR. The output terminal Q of the D-type flip-flop DFF2 is coupled to the input terminal D of the D-type flip-flop DFF3 and outputs a control signal DG. The output terminal Q of the D-type flip-flop DFF3 is coupled to the input terminal D of the D-type flip-flop DFF4 and outputs a control signal DB. The input terminals CKs of the D-type flip-flops DFF1~DFF4 all receive the row clock signal RC. The input terminal R of the D-type flip-flop DFF5 receives the LED enable signal LEN and the input terminal D of the D-type flip-flop DFF5 is coupled to the output terminal Q of the D-type flip-flop DFF4. The output terminal Q of the D-type flip-flop DFF5 is coupled to the bias voltage VBS.

One input terminal of the AND gate AND1 receives the LED enable signal LEN and the other input terminal of the AND gate AND1 is coupled between the D-type flip-flops DFF1 and DFF2. One input terminal of the AND gate AND2 receives the LED enable signal LEN and the other input terminal of the AND gate AND2 is coupled between the D-type flip-flops DFF2 and DFF3. One input terminal of the AND gate AND3 receives the LED enable signal LEN and the other input terminal of the AND gate AND3 is coupled between the D-type flip-flops DFF3 and DFF4. The output terminals of the AND gates AND1~AND3 output the control signals DR, DG and DB respectively.

The transistors M1~M2 are coupled in series between the red micro-LED R and the ground terminal GND, wherein the transistor M1 is controlled by the control signal DR and the transistor M2 is controlled by the bias voltage VBS. The transistors M3~M4 are coupled in series between the green micro-LED G and the ground terminal GND, wherein the transistor M3 is controlled by the control signal DG and the transistor M4 is controlled by the bias voltage VBS. The transistors M5~M6 are coupled in series between the blue micro-LED B and the ground terminal GND, wherein the transistor M5 is controlled by the control signal DB and the transistor M6 is controlled by the bias voltage VBS.

Figure 6:
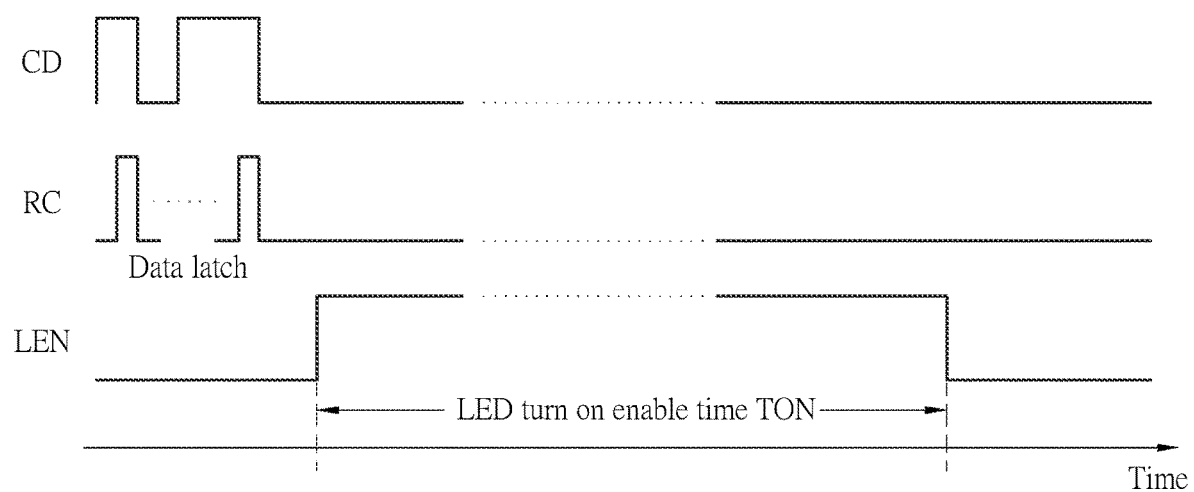

As shown in FIG. 6, the column data signal CD and the row clock signal RC are both pulse signals. The pulse width of the column data signal CD is greater than the pulse width of the row clock signal RC. The rising edge of the column data signal CD is earlier than the rising edge of the row clock signal RC, and the falling edge of the column data signal CD and the falling edge of the row clock signal RC are synchronized with each other, so the effect of data latch can be achieved. It should be noted that the LED enable signal LEN is also a pulse signal and its pulse width is the LED turn-on enabling period TON, which is used to enable the red micro-LED R, the green micro-LED G and the blue micro-LED B, but not limited to this.

Figure 7:
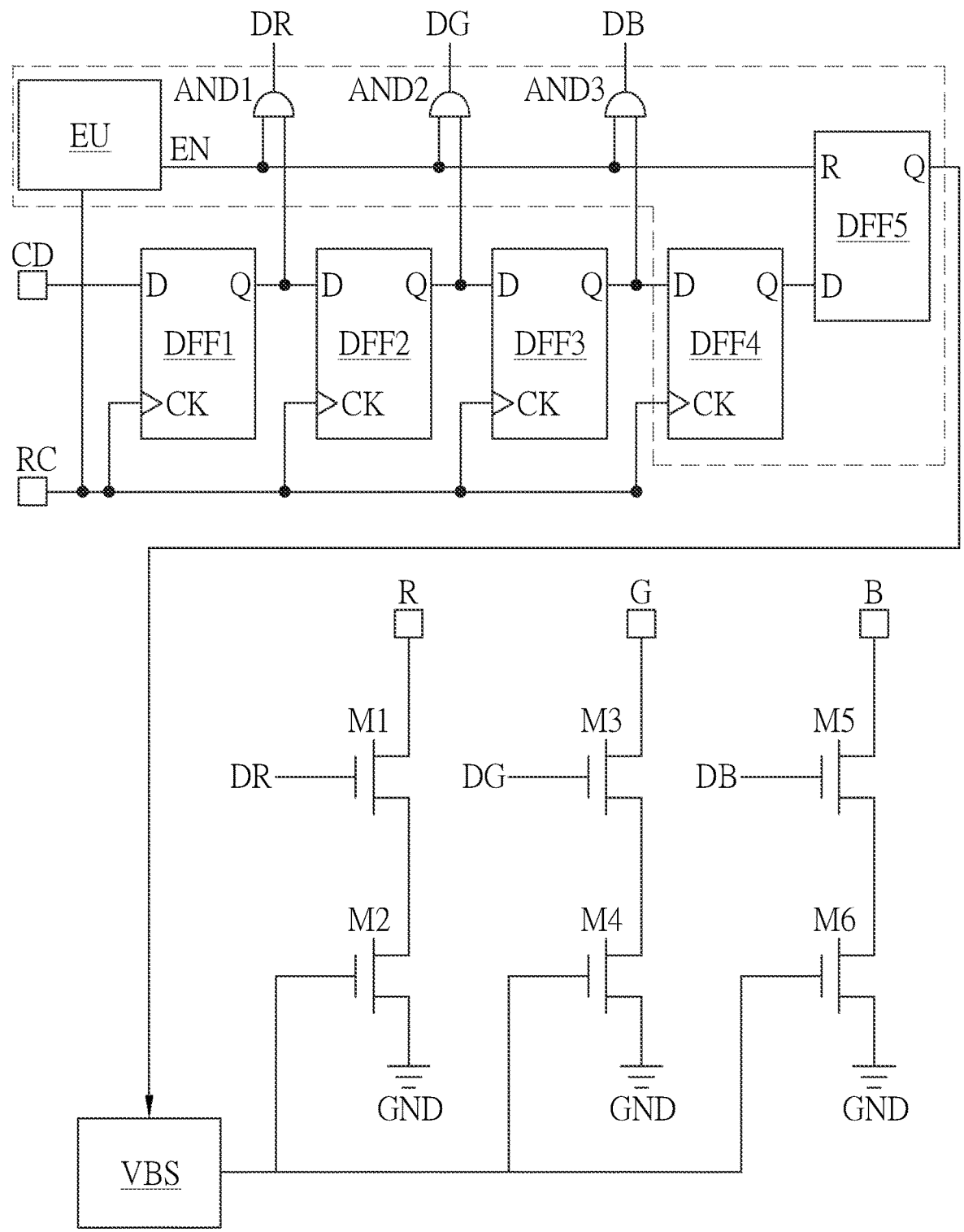
FIG. 7 and FIG. 8 illustrate the second embodiment of the μIC and its timing diagram in the invention respectively.

In the second embodiment, as shown in FIG. 7, the micro-LED integrated circuit μIC2 not only includes the conventional D-type flip-flops DFF1~DFF3 and transistors M1~M6, but also further includes AND gates AND1~AND3, D-type flip-flops DFF4~DFF5 and a LED turn-on enable unit EU, but not limited to this.

The input terminal D of the D-type flip-flop DFF1 receives the column data signal CD and the output terminal Q of the D-type flip-flop DFF1 is coupled to the input terminal D of the D-type flip-flop DFF2 and outputs a control signal DR. The output terminal Q of the D-type flip-flop DFF2 is coupled to the input terminal D of the D-type flip-flop DFF3 and outputs a control signal DG. The output terminal Q of the D-type flip-flop DFF3 is coupled to the input terminal D of the D-type flip-flop DFF4 and outputs a control signal DB. The LED enabling unit EU and the input terminals CK of the D-type flip-flops DFF1~DFF4 all receive the row clock signal RC. The input terminal R of the D-type flip-flop DFF5 is coupled to the LED turn-on enabling unit EU to receive the enable signal EN and the input terminal D of the D-type flip-flop DFF5 is coupled to the output terminal Q of the D-type flip-flop DFF4. The output terminal Q of the D-type flip-flop DFF5 is coupled to the bias voltage VBS.

One input terminal of the AND gate AND1 is coupled to the LED turn-on enabling unit EU to receive the enable signal EN and the other input terminal of the AND gate AND1 is coupled between the D-type flip-flops DFF1 and DFF2. One input terminal of the AND gate AND2 is coupled to the LED turn-on enabling unit EU to receive the enable signal EN and the other input terminal of the AND gate AND2 is coupled between the D-type flip-flops DFF2 and DFF3. One input terminal of the AND gate AND3 is coupled to the LED turn-on enabling unit EU to receive the enable signal EN and the other input terminal of the AND gate AND3 is coupled between the D-type flip-flops DFF3 and DFF4. The output terminals of the AND gates AND1~AND3 output the control signals DR, DG and DB respectively.

The transistors M1~M2 are coupled in series between the red micro-LED R and the ground terminal GND, wherein the transistor M1 is controlled by the control signal DR and the transistor M2 is controlled by the bias voltage VBS. The transistors M3~M4 are coupled in series between the green micro-LED G and the ground terminal GND, wherein the transistor M3 is controlled by the control signal DG and the transistor M4 is controlled by the bias voltage VBS. The transistors M5~M6 are coupled in series between the blue micro-LED B and the ground terminal GND, wherein the transistor M5 is controlled by the control signal DB and the transistor M6 is controlled by the bias voltage VBS.

Figure 8:
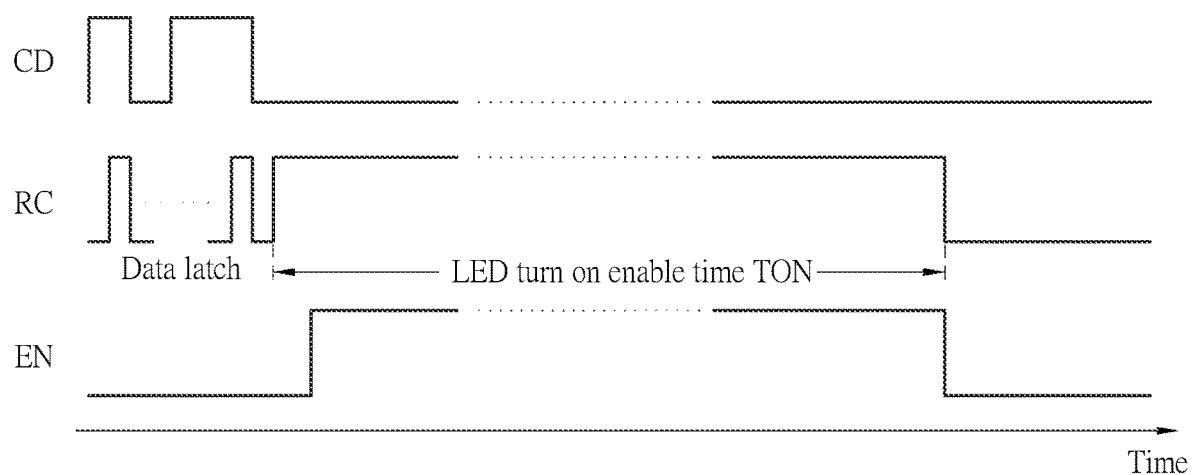

As shown in FIG. 8, the column data signal CD, the row clock signal RC and the enable signal EN are all pulse signals. It should be noted that LED turn-on enabling period TON in this embodiment is embedded in the row clock signal RC, so the μIC2 does not need to receive an additional LED enable signal, and the number of its input pins can be reduced, but not limited to this.

Figure 9:
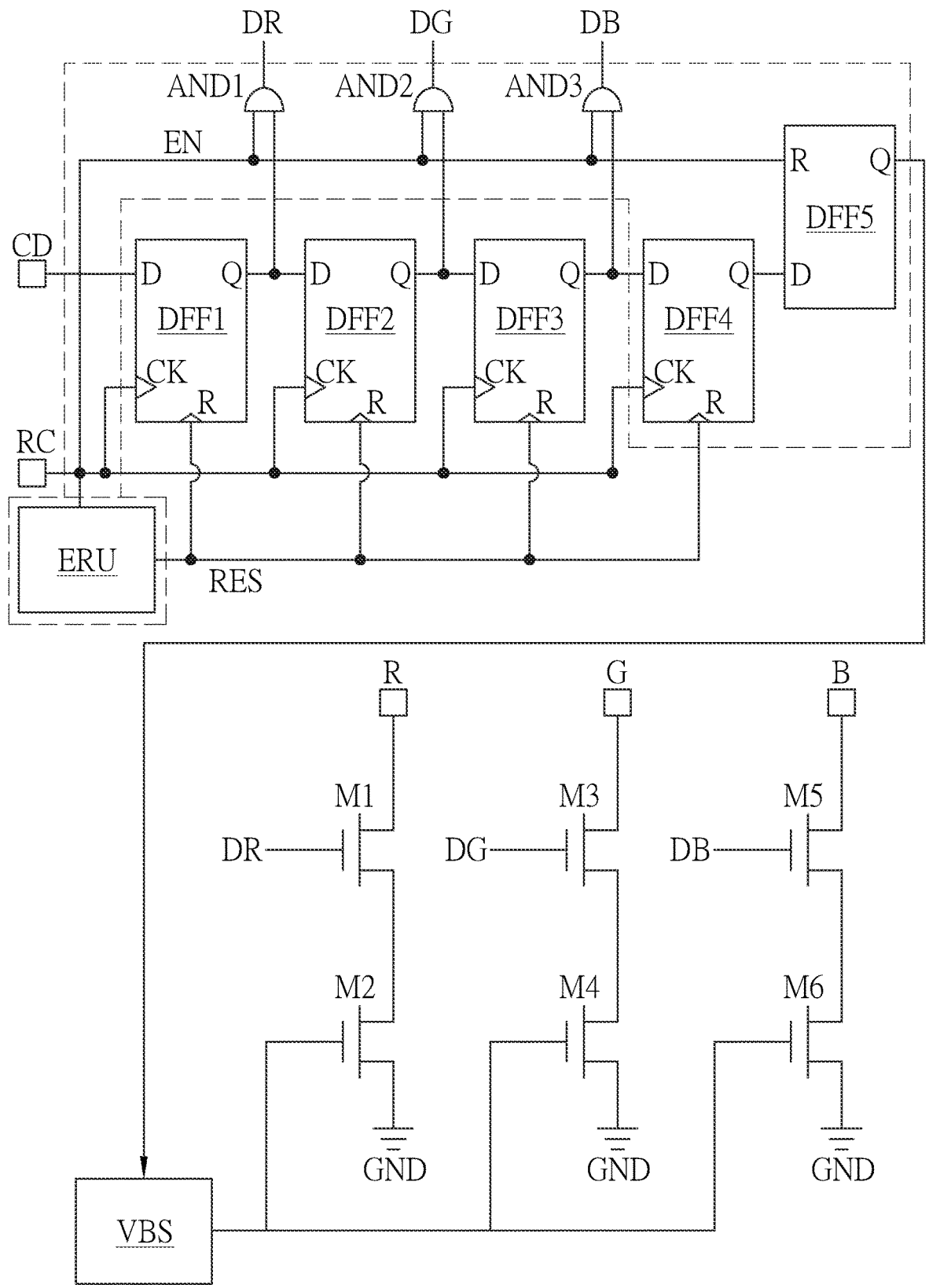
FIG. 9 and FIG. 10 illustrate the third embodiment of the μIC and its timing diagram in the invention respectively.

In the third embodiment, as shown in FIG. 9, the micro-LED integrated circuit μIC3 not only includes the conventional D-type flip-flops DFF1~DFF3 and transistors M1~M6, but also includes AND gate AND1~AND3, D-type flip-flops DFF4~DFF5 and a LED turn on enable and DFF reset unit ERU, but not limited to this.

The input terminal D of the D-type flip-flop DFF1 receives the column data signal CD and the output terminal Q of the D-type flip-flop DFF1 is coupled to the input terminal D of the D-type flip-flop DFF2 and outputs a control signal DR. The output terminal Q of the D-type flip-flop DFF2 is coupled to the input terminal D of the D-type flip-flop DFF3 and outputs a control signal DG. The output terminal Q of the D-type flip-flop DFF3 is coupled to the input terminal D of the D-type flip-flop DFF4 and outputs a control signal DB. The LED enable and DFF reset unit ERU and the input terminals CKs of the D-type flip-flops DFF1~DFF4 all receive the row clock signal RC. The input terminal R of the D-type flip-flop DFF5 is coupled to the LED turn-on enable and DFF reset unit ERU to receive the enable signal EN and the input terminal D is coupled to the output terminal Q of the D-type flip-flop DFF4. The output terminal Q of the D-type flip-flop DFF5 is coupled to the bias voltage VBS.

One input terminal of the AND gate AND1 is coupled to the LED turn-on enable and DFF reset unit ERU to receive the enable signal EN, and the other input terminal of the AND gate AND1 is coupled between the D-type flip-flops DFF1 and DFF2. One input terminal of the AND gate AND2 is coupled to the LED turn-on enable and DFF reset unit ERU to receive the enable signal EN and the other input terminal of the AND gate AND2 is coupled between the D-type flip-flops DFF2 and DFF3. One input terminal of the AND gate AND3 is coupled to the LED turn-on enable and DFF reset unit ERU to receive the enable signal EN and the other input terminal is coupled between the D-type flip-flops DFF3 and DFF4. The output terminals of the AND gates AND1~AND3 output the control signals DR, DG and DB respectively. In addition, the LED enable and DFF reset unit ERU is also respectively coupled to the input terminals R of the D-type flip-flops DFF1~DFF4 and provides a reset signal RES to the input terminals R of the D-type flip-flops DFF1~DFF4.

The transistors M1~M2 are coupled in series between the red micro-LED R and the ground terminal GND, wherein the transistor M1 is controlled by the control signal DR and the transistor M2 is controlled by the bias voltage VBS. The transistors M3~M4 are coupled in series between the green micro-LED G and the ground terminal GND, wherein the transistor M3 is controlled by the control signal DG and the transistor M4 is controlled by the bias voltage VBS. The transistors M5~M6 are coupled in series between the blue micro-LED B and the ground terminal GND, wherein the transistor M5 is controlled by the control signal DB and the transistor M6 is controlled by the bias voltage VBS.

Figure 10:
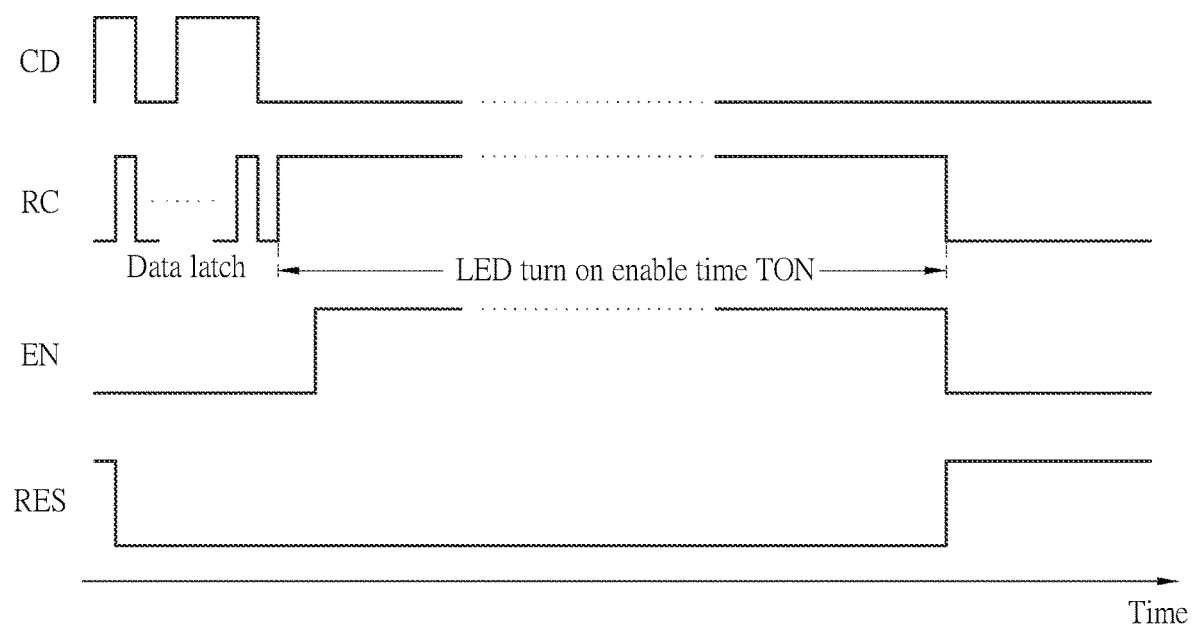

As shown in FIG. 10, the column data signal CD, the row clock signal RC, the enable signal EN and the reset signal RES are all pulse signals. It should be noted that the LED turn-on and enable period TON in this embodiment is embedded in the row clock signal RC, so the micro-LED integrated circuit μIC3 does not need to receive an additional LED enable signal, and the number of its input pins can be reduced, but not limited to this. In addition, the falling edge of the reset signal RES is synchronized with the rising edge of the row clock signal RC and the rising edge of the reset signal RES is synchronized with the end time of the LED turn-on enable period TON and the falling edge of the enable signal EN, but not limited to this.

Figure 11:
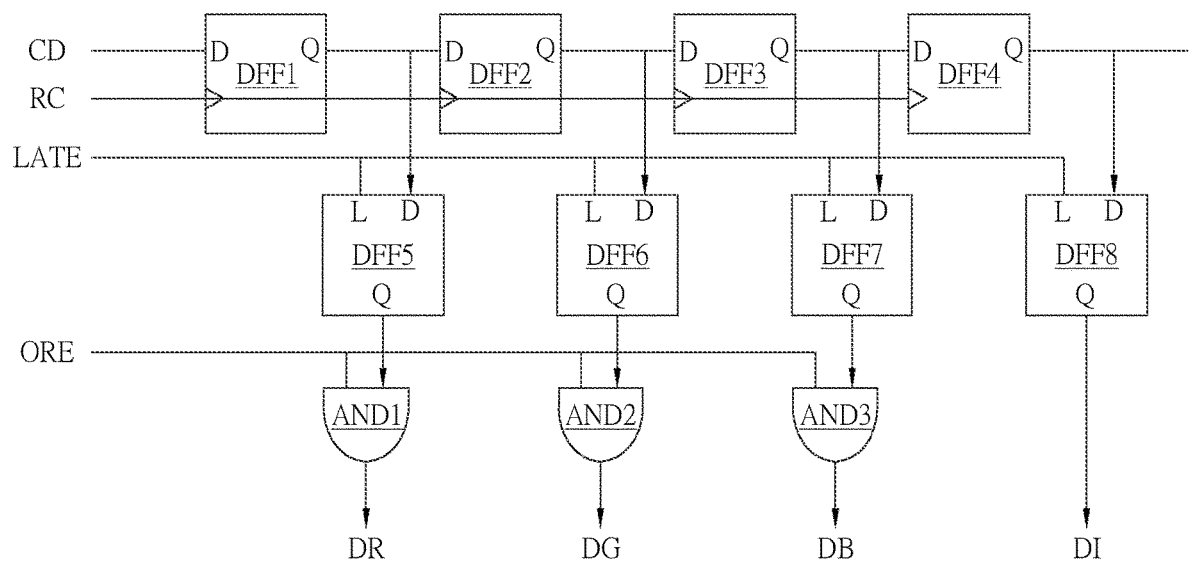
FIG. 11 illustrates a schematic diagram of the μIC further receiving a latch enable signal and outputting a reset signal.

Please refer to FIG. 11. FIG. 11 shows a schematic diagram of the micro-LED integrated circuit μIC further receiving the latch enable signal and outputting the reset signal. As shown in FIG. 11, the input terminal D of the D-type flip-flop DFF1 receives the column data signal CD and the output terminal Q of the D-type flip-flop DFF1 is coupled to the input terminal D of the D-type flip-flop DFF2. The output terminal Q of the D-type flip-flop DFF2 is coupled to the input terminal D of the D-type flip-flop DFF3. The output terminal Q of the D-type flip-flop DFF3 is coupled to the input terminal D of the D-type flip-flop DFF4. The input terminals > of D-type flip-flops DFF1~DFF4 all receive the row clock signal RC.

The input terminal L of the D-type flip-flop DFF5 receives the latch enable signal LATE and the input terminal D of the D-type flip-flop DFF5 is coupled between the D-type flip-flops DFF1 and DFF2 and receives the control signal DR. The input terminal L of the D-type flip-flop DFF6 receives the latch enable signal LATE and the input terminal D of the D-type flip-flop DFF6 is coupled between the D-type flip-flops DFF2 and DFF3 and receives the control signal DG. The input terminal L of the D-type flip-flop DFF7 receives the latch enable signal LATE and the input terminal D of the D-type flip-flop DFF7 is coupled between the D-type flip-flops DFF3 and DFF4 and receives the control signal DB. The input terminal L of the D-type flip-flop DFF8 receives the latch enable signal LATE and the input terminal D of the D-type flip-flop DFF8 is coupled to the output terminal Q of the D-type flip-flop DFF4 and receives the control signal DI.

One input terminal of the AND gate AND1 receives the output reset signal ORE and the other input terminal of the AND gate AND1 is coupled to the output terminal Q of the D-type flip-flop DFF5 and receives the control signal DR. One input terminal of the AND gate AND2 receives the output reset signal ORE and the other input terminal of the AND gate AND2 is coupled to the output terminal Q of the D-type flip-flop DFF6 and receives the control signal DG. One input terminal of the AND gate AND3 receives the output reset signal ORE and the other input terminal of the AND gate AND3 is coupled to the output terminal Q of the D-type flip-flop DFF7 and receives the control signal DB. The output terminals of AND-AND3 respectively output the control signals DR, DG and DB, and the output terminal Q of D-type flip-flop DFF8 outputs control signal DI, but not limited to this.

Figure 12:
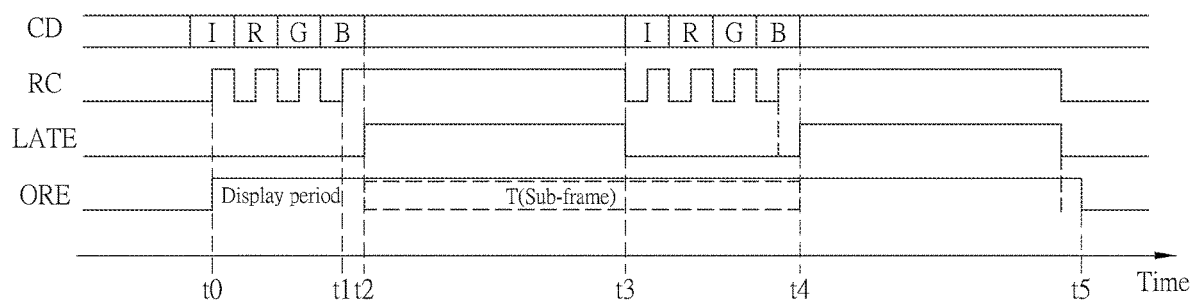
FIG. 12 and FIG. 13 illustrate the timing diagrams of the μIC in FIG. 11 operating in the All-on mode and the pulse-width modulation (PWM) mode respectively.
Figure 13:
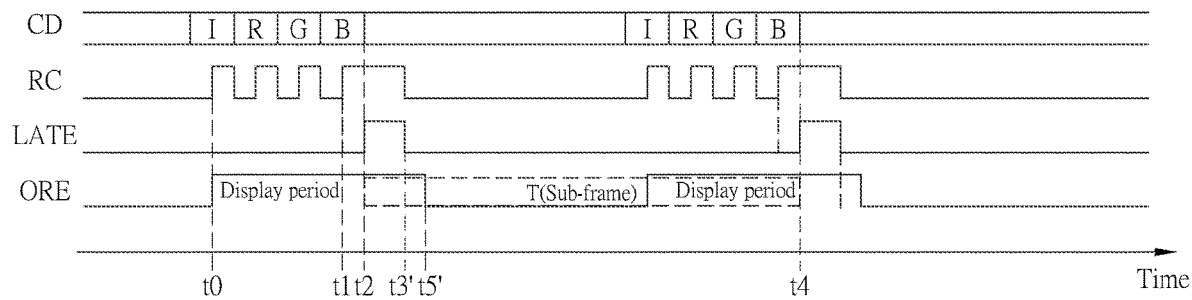

Next, please refer to FIG. 12 and FIG. 13. FIG. 12 and FIG. 13 illustrate the timing diagrams of the micro-LED integrated circuit µIC in FIG. 11 operating in the all-on mode and the pulse-width modulation (PWM) mode, respectively.

As shown in FIG. 12, after the row clock signal RC changes from low-level to high-level at time t1, the latch enable signal LATE changes from low-level to high-level at the time t2 when the column data signal CD enters the blanking interval. In the all-on mode, both the row clock signal RC and the latch enable signal LATE maintain high-level until the time t3 when the column data signal CD ends the blanking interval, does it synchronously change from high-level to low-level. The rising edge of the output reset signal ORE is synchronized with the rising edge of the row clock signal RC at the time t0 and remains at high-level until the time t5 before turning to low-level. The time length T of the sub-frame is from the time t2 to the time t4; that is to say, the start time and the end time of the sub-frame are synchronized with the rising edges of the latch enable signal LATE, but not limit to this.

As shown in FIG. 13, after the row clock signal RC changes from low-level to high-level at the time t1, the latch enable signal LATE changes from low-level to high-level at the time t2 when the column data signal CD enters the blanking interval. In the PWM mode, the row clock signal RC and the latch enable signal LATE will be synchronously changed from high-level to low-level at the time t3' in the blanking interval of the column data signal CD, and the rising edge of the output reset signal ORE is synchronized with the rising edge of the row clock signal RC at the time t0 and maintained at high-level.

After the row clock signal RC and the latch enable signal LATE are synchronously changed from high-level to low-level at the time t3' in the blanking interval of the column data signal CD, the output reset signal ORE is also changed to low-level at the time t5' in the blanking interval of the column data signal CD. The time length T of the sub-frame is from the time t2 to the time t4; that is to say, the start time and the end time of the sub-frame are synchronized with the rising edges of the latch enable signal LATE, but not limit to this.

Figure 14:
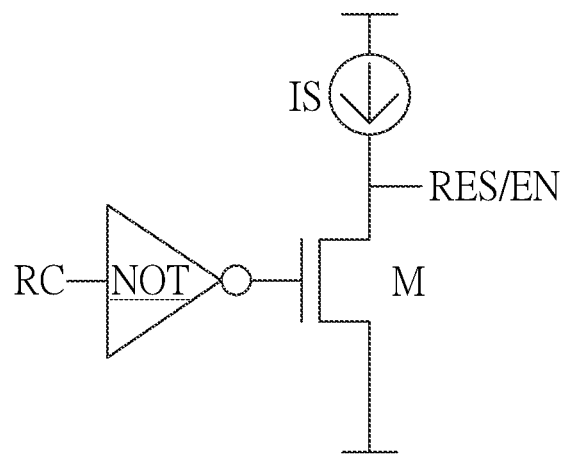
FIG. 14 illustrates a schematic diagram of a pulse filter for the DFF reset signal/the enable signal.

Please refer to FIG. 14. FIG. 14 illustrates a schematic diagram of a pulse filter used for the DFF reset signal/the enable signal. As shown in FIG. 14, the pulse filter can include a NOT gate NOT, a current source IS and a transistor M. The current source IS and the transistor M are coupled in series and the NOT gate NOT is coupled to the gate of the transistor M. The NOT gate NOT is coupled to the row clock signal RC and the DFF reset signal RES/the enable signal EN is coupled between the current source IS and the transistor M, so the DFF reset signal RES/the enable signal EN can be filtered.

Figure 15:
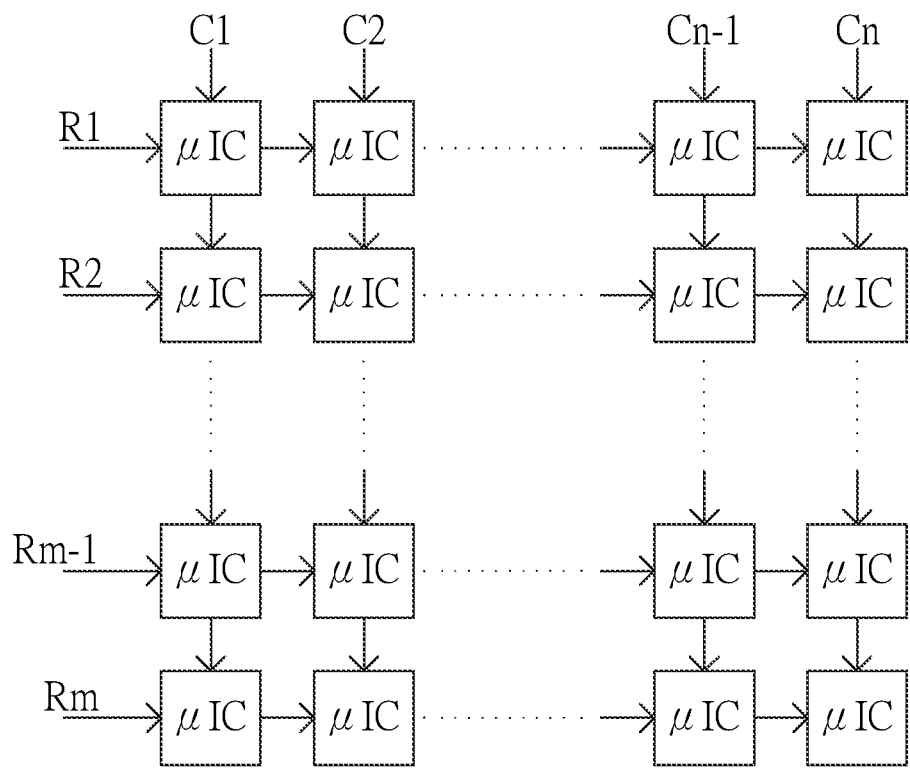
FIG. 15 illustrates a schematic diagram of inputting row clock signals and column data signals to (m*n) μICs arranged in a matrix.
Figure 16:
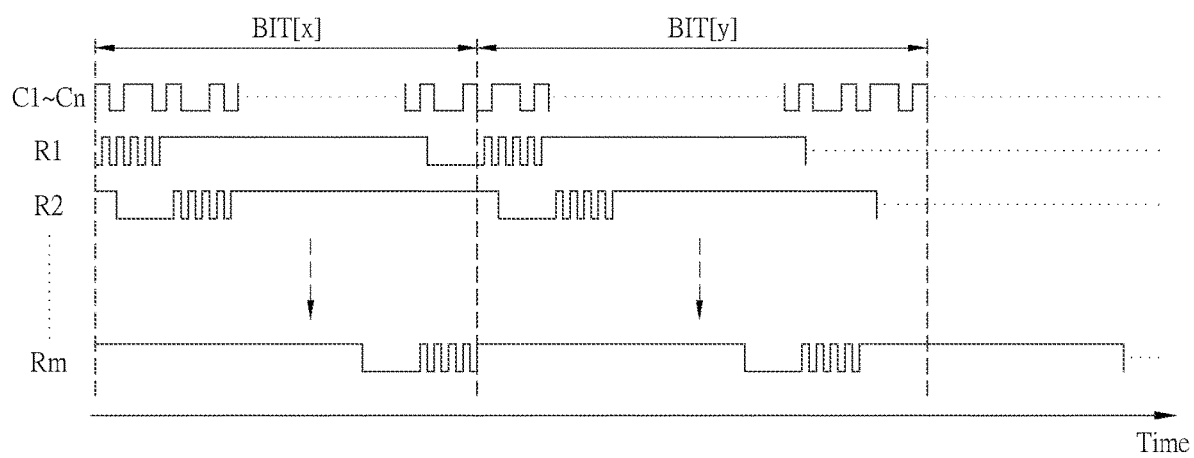
FIG. 16 illustrates a timing diagram of the row data signals and the row clock signals in consecutive x-th bit and y-th bit.

Please refer to FIG. 15 and FIG. 16. FIG. 15 illustrates a schematic diagram of the row clock signals R1~Rm and the column data signals C1~Cn being inputted to the (m*n) µICs arranged in a matrix. FIG. 16 illustrates a timing diagram of the row data signals C1~Cn and the row clock signals R1~Rm corresponding to the consecutive x-th bit and y-th bit.

As shown in FIG. 15, the n columns of µICs receive the column data signals C1~Cn respectively, and the m rows of µICs receive the row clock signals R1~Rm respectively.

As shown in FIG. 16, for the x-th bit BIT[x], the row data signals C1~Cn are the same, and different data pulses are sequentially transmitted at the same time, while the row clock signals R1~Rm are different, the row clock signals R1~Rm respectively transmit clock pulses at different times in sequence; that is to say, the row clock signal R1 first transmits clock pulse, and then the row clock signal R2 transmits clock pulse, and so on. Finally, clock pulse is transmitted by the row clock signal Rm.

In the same way, for the y-th bit BIT[y], the row data signals C1~Cn are the same, and different data pulses are transmitted in sequence, while the row clock signals R1~Rm are not the same. The row clock signals R1~Rm respectively transmit clock pulses at different times in sequence, that is, the row clock signal R1 first transmits clock pulse, then the row clock signal R2 transmits clock pulse, and so on, and finally the row clock signal Rm transmits clock pulse.

Next, the circuit structures of several different row/column drivers proposed by the invention will be described in detail.

Figure 17:
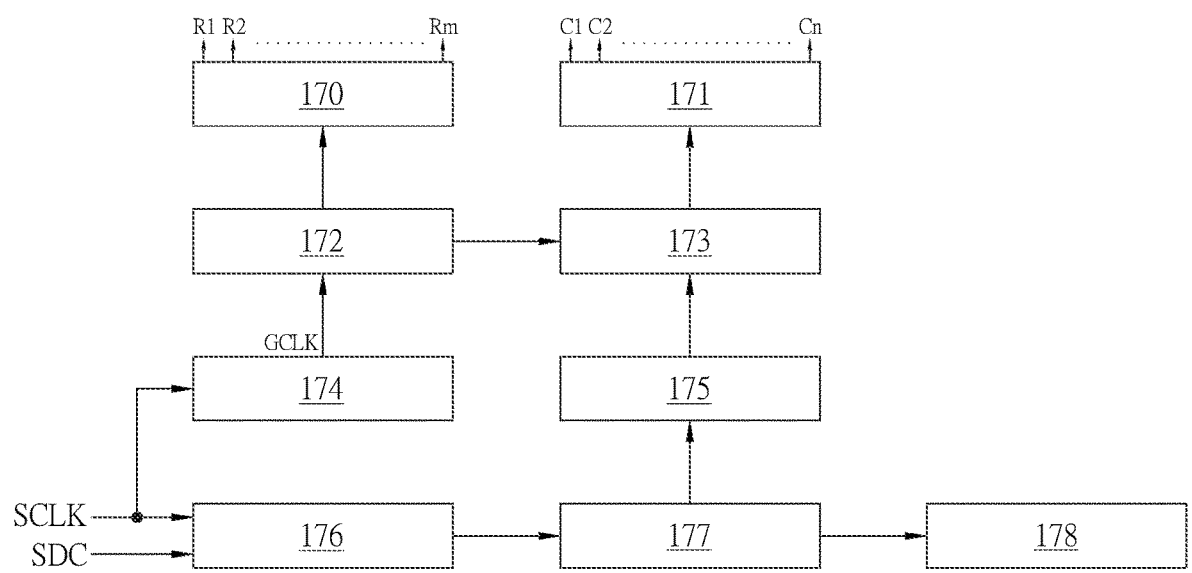
FIG. 17 to FIG. 20 illustrate functional block diagrams of the first embodiment to the fourth embodiment of the row/column driver of the invention respectively.

As shown in FIG. 17, the row/column driver 17 includes a row driver 170, a column driver 171, a word line decoder 172, a frame buffer 173, a clock buffer 174, a data arranging unit 175, a serial protocol interface 176, a protocol decoder 177 and a register 178. The protocol decoder 177 is coupled between the serial protocol interface 176 and the register 178. The data arranging unit 175 is coupled between the protocol decoder 177 and the frame buffer 173. The word line decoder 172 is coupled among the clock buffer 174, the row driver 170 and the frame buffer 173. The frame buffer 173 is coupled among the word line decoder 172, the data arranging unit 175 and the column driver 171. The serial protocol interface 176 receives the serial clock signal SCLK, the serial data and the control signal SDC respectively. The clock buffer 174 receives the serial clock signal SCLK and converts it into a gray-scale clock signal GCLK to output the gray-scale clock signal GCLK to the word line decoder 172. The row driver 170 outputs the row clock signals R1~Rm respectively, and the column driver 171 outputs the column data signals C1~Cn respectively, but not limited to this.

Figure 18:
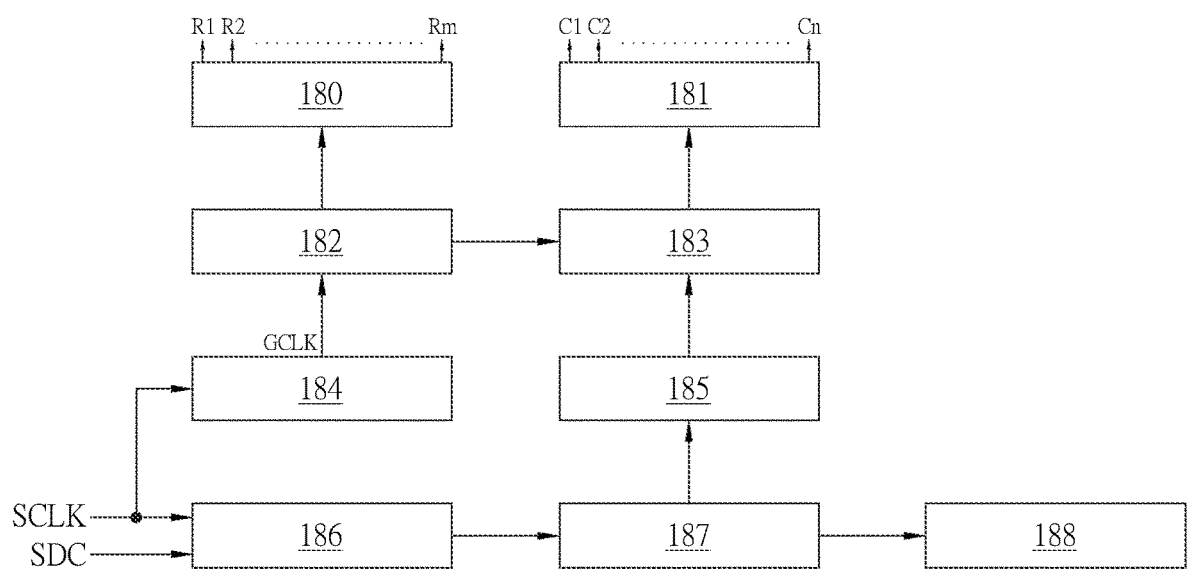

As shown in FIG. 18, the row/column driver 18 includes a row driver 180, a column driver 181, a word line decoder 182, a frame buffer 183, a phase-locked loop (PLL) 184, a data arranging unit 185, a serial protocol interface 186, and a protocol decoder 187 and a register 188. The row/column driver 18 of FIG. 18 is different from the row/column driver 17 of FIG. 17 in that the row/column driver 18 receives the serial clock signal SCLK through the phase-locked loop 184 and converts the serial clock signal SCLK into a gray-scale clock signal GCLK and outputs the gray-scale clock signal GCLK to the word line decoder 182, but not limited to this.

Figure 19:
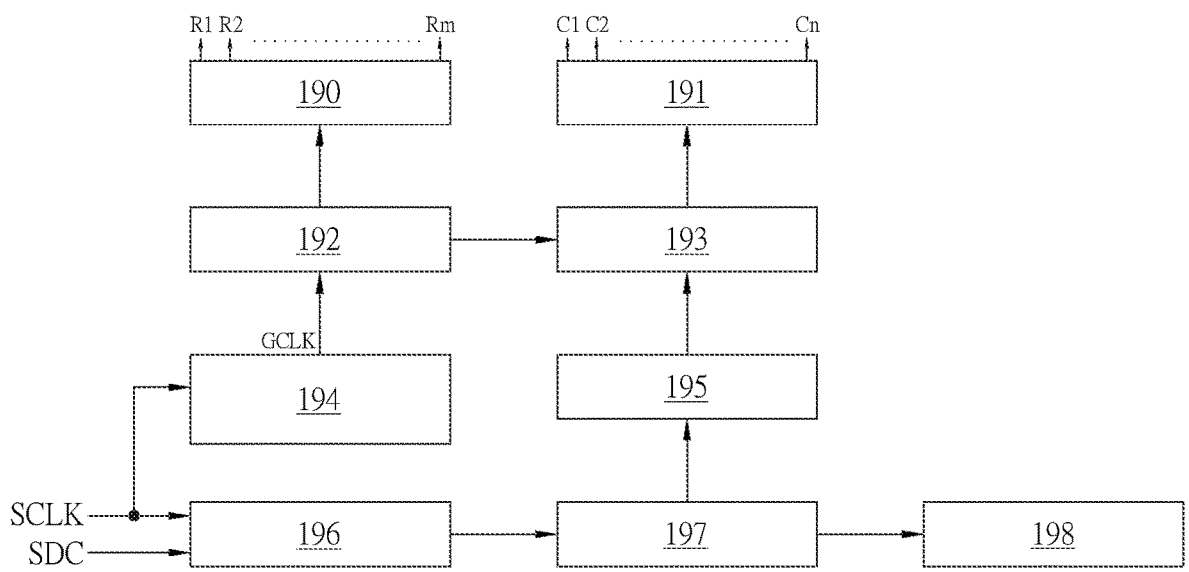

As shown in FIG. 19, the row/column driver 19 includes a row driver 190, a column driver 191, a word line decoder 192, a frame buffer 193, an oscillator (OSC) and one-time programmable (OTP) 194, a data arranging unit 195, a serial protocol interface 196, a protocol decoder 197 and a register 198. The row/column driver 19 of FIG. 19 is different from the row/column drivers 17 and 18 of FIG. 17 and FIG. 18 in that the row/column driver 19 receives the serial clock signal SCLK through the OSC and OTP 194 and converts the serial clock signal SCLK into a gray-scale clock signal GCLK and them outputs the gray-scale clock signal GCLK to the word line decoder 192, but not limited to this.

Figure 20:
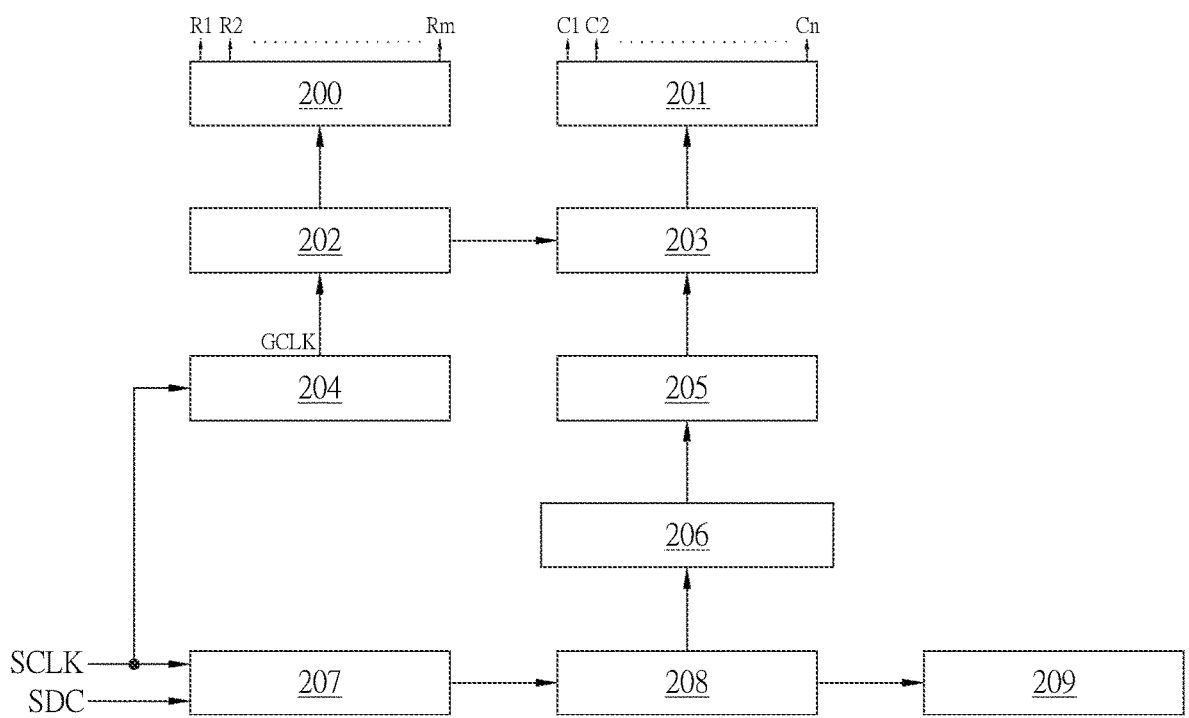

As shown in FIG. 20, the row/column driver 20 includes a row driver 200, a column driver 201, a word line decoder 202, a frame buffer 203, a clock buffer 204, a data arranging unit 205, a data correction and mapping unit 206, a serial protocol interface 207, a protocol decoder 208 and a register 209. The row/column driver 20 of FIG. 20 is different from the row/column driver 17 of FIG. 17 in that the row/column driver 20 also includes the data correction and mapping unit 206 coupled between the protocol decoder 208 and the data arranging unit 205. The data correction and mapping unit 206 is used to perform data correction and mapping process before data arrangement, but not limited to this.

Figure 21A:
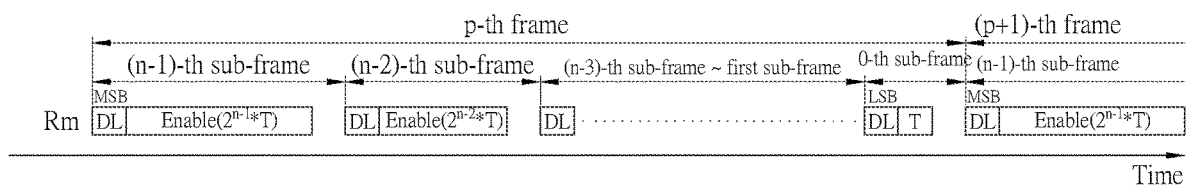
FIG. 21A and FIG. 21B illustrate timing diagrams of a m-th row clock signal Rm when the binary PWM method is adopted for a p-th frame.

Next, please refer to FIG. 21A. FIG. 21A shows a timing diagram of the n-bit p-th frame using the binary PWM method. As shown in FIG. 21A, if the p-th frame is taken as an example for description, the p-th frame of n bits includes n sub-frames in order, which are a (n−1)-th sub-frame, a (n−2)-th sub-frame, a (n−3)-th sub-frame, . . . , a first sub-frame and a 0-th sub-frame in order. The (n−1)-th sub-frame has a most significant bit MSB and the 0-th sub-frame has a least significant bit LSB.

For the row clock signal Rm of the m-th row, in the case of using the binary PWM method, if the enabling time length corresponding to the 0-th sub-frame is T, then the enabling time length corresponding to the (n−1)-th sub-frame is $(2^{n-1}*T)$, the enabling time length corresponding to the (n−2)-th sub-frame is $(2^{n-2}*T)$, and the enabling time length corresponding to the (n−3)-th sub-frame is $(2^{n-3}*T)$, the rest can be analogized, so it will be not repeated here.

Figure 2:
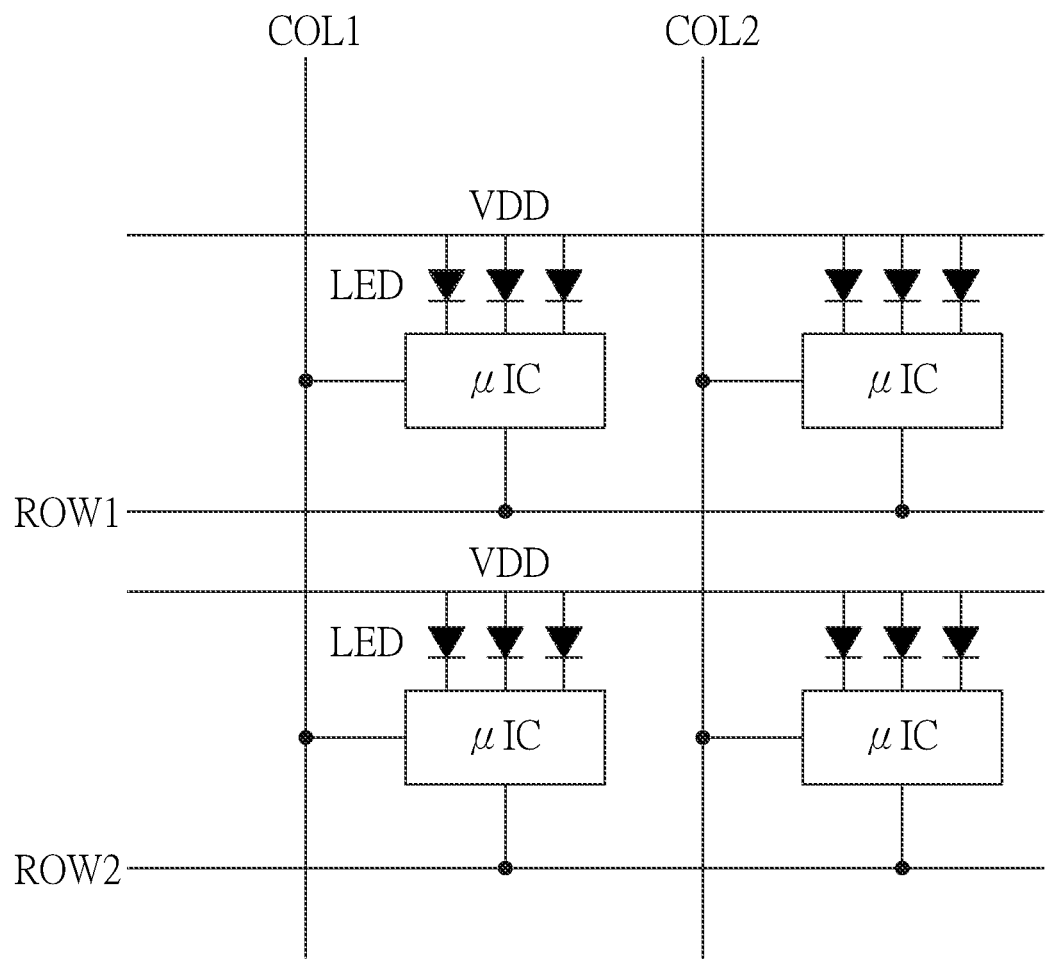
FIG. 2 illustrates an enlarged schematic diagram of a part in a dashed frame in FIG. 1B.
Figure 21B:
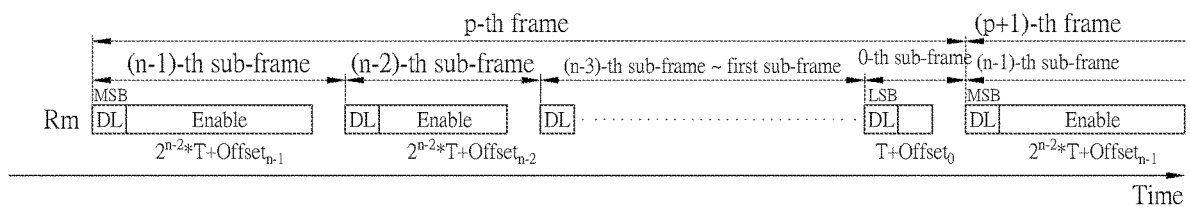

In addition, as shown in FIG. 2, the following operations can be performed in the first embodiment. In FIG. 21B, for the row clock signal Rm of the m-th row, in the case of using the binary PWM method, if the enabling time length corresponding to the 0-th sub-frame is $(T+Offset_0)$, then the enabling time length corresponding to the (n−1)-th sub-frame is $(2^{n-2}*T+Offset_{n-1})$, the enabling time length corresponding to the (n−2)-th sub-frame is $(2^{n-2}*T+Offset_{n-2})$, the enabling time length corresponding to the (n−3)-th sub-frame is $(2^{n-2}*T+Offset_{n-3})$, and the rest can be deduced by analogy, it will not repeat here. In other words, the enabling time length of each sub-frame can include different enabling time offsets ($Offset_0$~$Offset_{n-1}$), but not limited to this.

Figure 22:
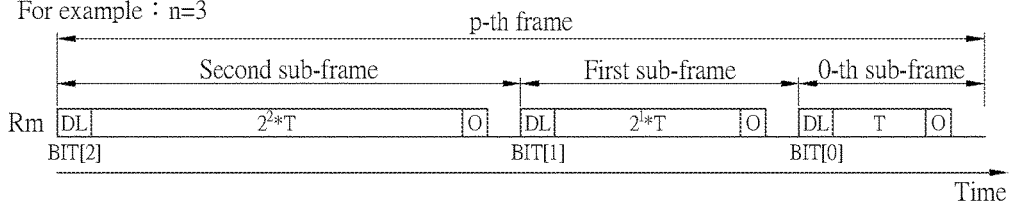
FIG. 22 illustrates a timing diagram of the m-th row clock signal Rm when n=3 in FIG. 21A.

If n=3 in FIG. 21A, as shown in FIG. 22, the p-th frame of 3 bits sequentially includes a second sub-frame corresponding to a second bit BIT[2], a first sub-frame corresponding to a first bit BIT[1] and a 0-th sub-frame corresponding to a 0-th bit BIT[0]. For the row clock signal Rm of the m-th row, in the case of the 3-bit p-th frame using the binary PWM method, it is assumed that the enabling time length corresponding to the 0-th sub-frame is T, the enabling time length corresponding to the second sub-frame is $2^2*T=4T$, and the enabling time length corresponding to the first sub-frame is $2^1*T=2T$.

Figure 23:
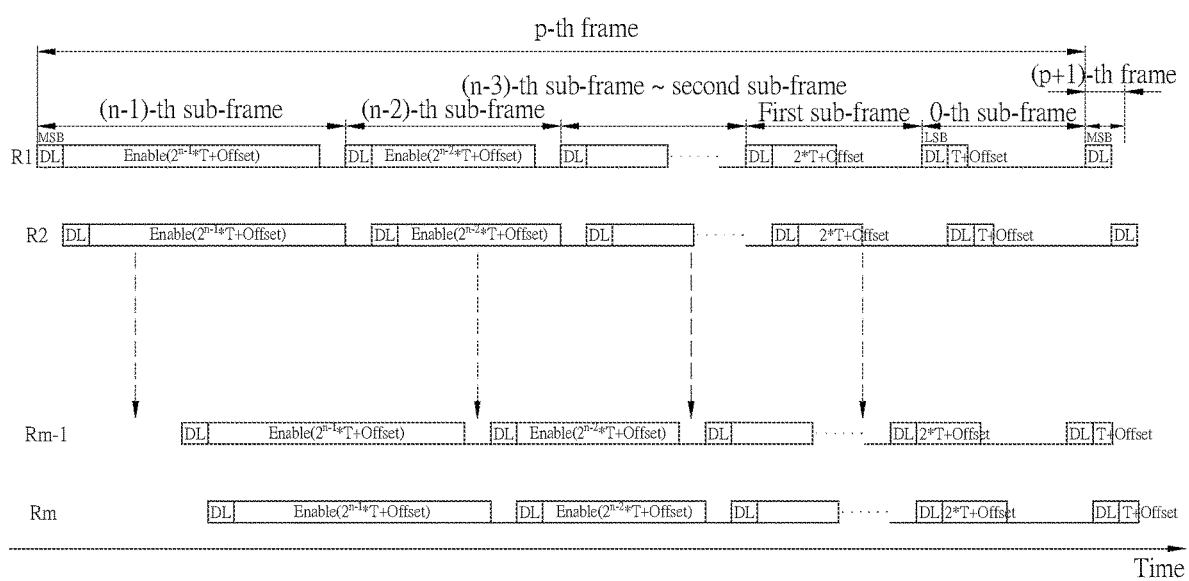
FIG. 23 illustrates a timing diagram of a first row clock signal R1 to a m-th row clock signal Rm when the binary PWM method is adopted for a p-th frame.

In another embodiment, as shown in FIG. 23, when a binary PWM method is used, for the row clock signal R1 of the first row, if the enabling time length corresponding to the 0-th sub-frame is (T+Offset), then the enabling time length corresponding to the (n−1)-th sub-frame is $(2^{n-1}*T+Offset)$, the enabling time length corresponding to the (n−2)-th sub-frame is $(2^{n-2}*T+Offset)$, the enabling time length corresponding to the (n−3)-th sub-frame is $(2^{n-3}*T+Offset)$, . . . and the enabling time length corresponding to the first sub-frame is $(2^1*T+Offset)$, and the rest can be deduced by analogy, and will not be repeated here. In other words, the enabling time length of each sub-frame can include the same enabling time offset, but not limited to this.

For the row clock signal R2 of the second row, the start time of the row clock signal R2 of the second row is later than the start time of the row clock signal R1 of the first row. Similarly, if the enabling time length corresponding to the 0-th sub-frame is (T+Offset), then the enabling time length corresponding to the (n−1)-th sub-frame is $(2^{n-1}*T+Offset)$, the enabling time length corresponding to the (n−2)-th sub-frame is $(2^{n-2}*T+Offset)$, and the enabling time length corresponding to the (n−3)-th frame is $(2^{n-3}*T+Offset)$, . . . , the enabling time length corresponding to the first frame is $(2^1*T+Offset)$, and the rest can be deduced by analogy, and will not be repeated here.

Similarly, for the row clock signal Rm of the m-th row, the start time of the row clock signal Rm of the m-th row is later than the start time of the row clock signal Rm−1 of the (m−1)-th row. In the case of using the binary PWM method, if the enabling time length corresponding to the 0-th sub-frame is (T+Offset), the enabling time length corresponding to the (n−1)-th sub-frame is $(2^{n-1}T+Offset)$, the enabling time length corresponding to the (n−2)-th sub-frame is $(2^{n-2}*T+Offset)$, . . . , the enabling time length corresponding to the first frame is $(2^1*T+Offset)$, and the rest can be deduced by analogy, so it will not repeat here.

Figure 24:
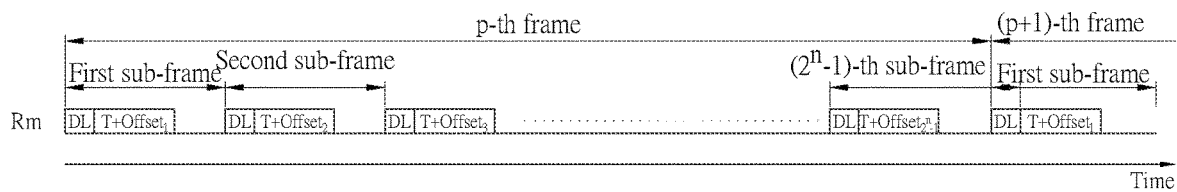
FIG. 24 illustrates a timing diagram of a m-th row clock signal Rm when the distributed PWM method is adopted for a p-th frame.

In another embodiment, as shown in FIG. 24, in the case of using a distributed PWM method, the p-th frame of n bits can include (2n−1) sub-frames, and for the row clock signal Rm of the m-th row, there can be different enabling time offsets $Offset_1$~$Offset_{2n-1}$ for each frame; for example, the enabling time length of the first frame is $(T+Offset_1)$, the enabling time length of the second frame is $(T+Offset_2)$, . . . , the enabling time length of the (2n−1)-th frame is $(T+Offset^{2n-1})$, but not limited to this.

Figure 25:
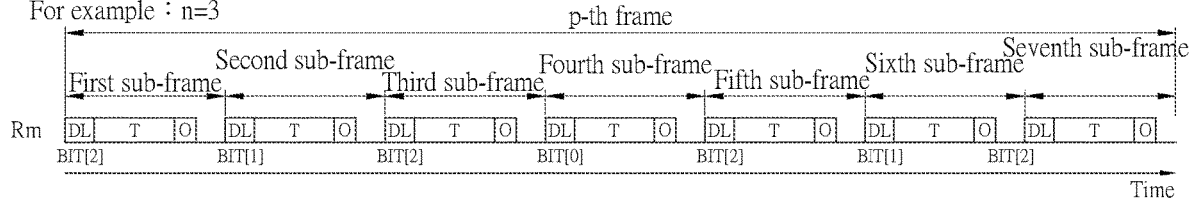
FIG. 25 illustrates a timing diagram of the m-th row clock signal Rm when n=3 in FIG. 24.

If n=3 in FIG. 24, as shown in FIG. 25, the p-th frame can include $(2^3-1)=7$ sub-frames; that is to say, for the row clock signal Rm of m-th rows, the enabling time lengths corresponding to the first sub-frame to the seventh sub-frame can be $T+offset_1$, $T+offset_2$, . . . , $T+offset_7$, but not limited to this.

Figure 26:
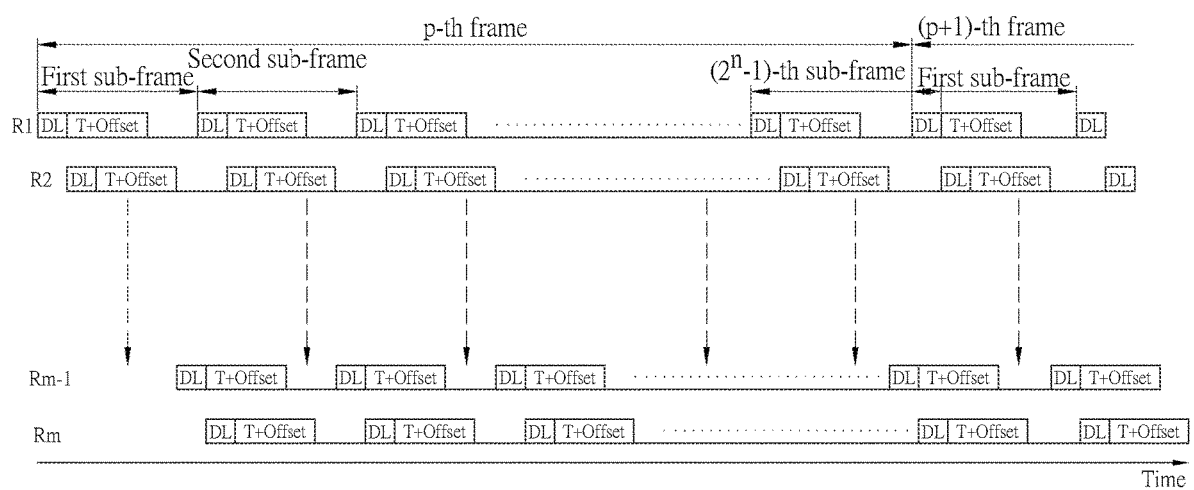
FIG. 26 illustrates a timing diagram of the first row clock signal R1 to the m-th row clock signal Rm when the distributed PWM method is adopted for the p-th frame.

In another embodiment, as shown in FIG. 26, in the case of using a distributed PWM method, for the row clock signal R1 of the first row, the enabling time length corresponding to the first sub-frame is (T+Offset), the enabling time length corresponding to the second sub-frame is (T+Offset), . . . , the enabling time length corresponding to the (2n−1)-th sub-frame is (T+Offset). For the row clock signal R2 of the second row, the start time of the row clock signal R2 of the second row is later than the start time of the row clock signal R1 of the first row, the enabling time length corresponding to the first sub-frame is (T+Offset), the enabling time length corresponding to the second frame is (T+Offset), . . . , the enabling time length of the (2n−1)-th frame is (T+Offset), and the rest can be deduced by analogy, so it will not repeat here.

Figure 27A:
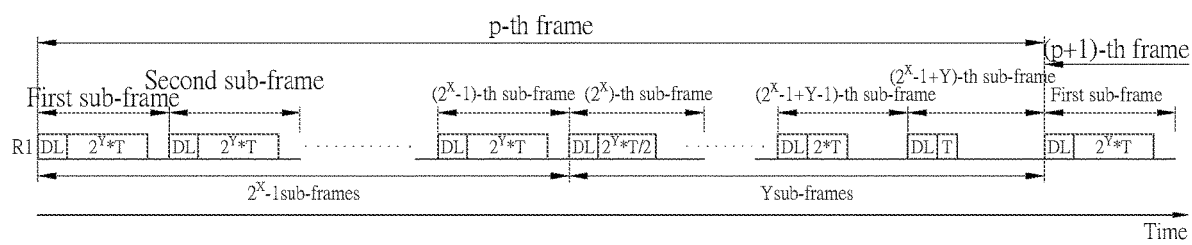
FIG. 27A illustrates a timing diagram of the first row clock signal R1 when the distributed and binary mixed PWM method is adopted for the p-th frame.

In practical applications, as shown in FIG. 27A, if the p-th frame includes (X+Y) bits, X and Y are both positive integers, and the distributed and binary mixed PWM method can be used for the p-th frame. For the row clock signal R1 of the first row, the X bits in the (X+Y) bits of the p-th frame adopts the distributed PWM method and the Y bits in the (X+Y) bits of the p-th frame adopts binary PWM method, then the p-th frame includes $(2^X-1)+Y$ sub-frames, of which the $(2^X-1)$ sub-frames corresponding to the X bits, that is to say, the first sub-frame to the $(2^X-1)$-th sub-frame all have the enabling time length $(2^Y*T)$, and the Y sub-frames corresponding to Y bits, that is, the 2-th frame to the $(2^X-1+Y)$-th sub-frame have the enabling time lengths $(2^Y*T/2)$, . . . , $2^1*T$, $2^0*T$, but not limited to this.

It should be noted that for the row clock signal R1 of the first row, the enabling time length of each of the $(2^X-1)+Y$ sub-frames included in the p-th frame can include the same enabling time offset or different enabling time offsets, but not limited to this. In addition, the Y sub-frames corresponding to the Y bits (that is, the $2^X$ sub-frame to the $(2^X-1+Y)$ sub-frame) can also be uniformly interlaced in the $(2^X-1)$ sub-frames (that is, the first frame to the $(2^X-1)$ second frame) corresponding to the X bits, but not limited to this.

Figure 27B:
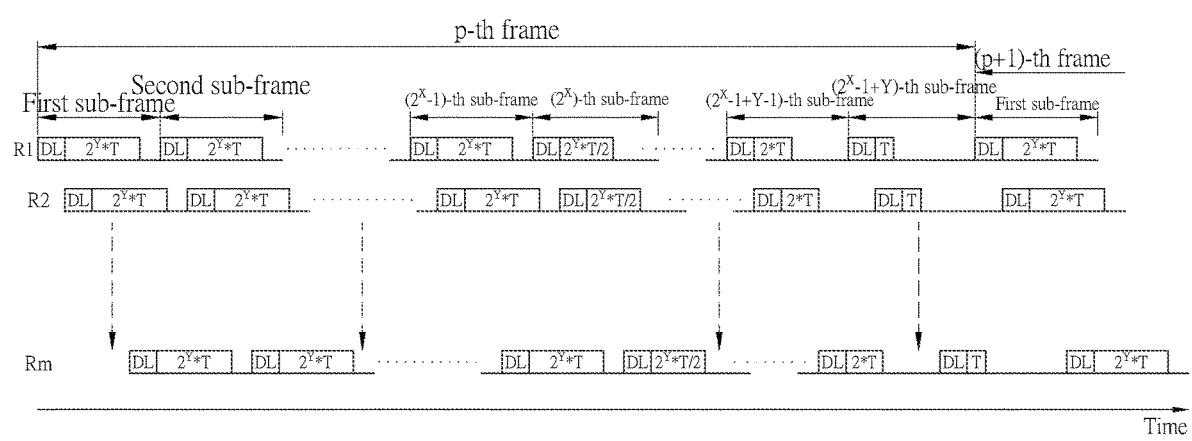
FIG. 27B illustrates a timing diagram of the first row clock signal R1 to the m-th row clock signal Rm when the distributed and binary mixed PWM method is adopted for the p-th frame.

As shown in FIG. 27B, for the row clock signal R2 of the second row, the start time of the row clock signal R2 of the second row is later than the start time of the row clock signal R1 of the first row, the enabling time lengths of the first sub-frame to the $(2^X-1)$-th sub-frame using the distributed PWM method are all $(2^Y*T)$, and the enabling time lengths of the $2^X$-th sub-frame to the $(2^X-1+Y)$-th sub-frame using the binary PWM method are $(2^Y*T/2)$, . . . , $2^1*T$, $2^0*T$ respectively, but not limited to this.

Similarly, for the row clock signal Rm of the m-th row, the start time of the row clock signal Rm of the m-th row is later than the start time of the row clock signal (Rm−1) of the (m−1)-th row. The enabling time lengths of the first sub-frame to the $(2^X-1)$ sub-frame using the distributed PWM method is $(2^Y*T)$, and the enabling time lengths of the $2^X$-th frame to the $(2^X-1+Y)$-th frame using the binary PWM method are $(2^Y*T/2)$, . . . , $2^1*T$, $2^0*T$, and the rest can be deduced by analogy, so it will not repeat here.

It should be noted that for each of the row clock signal R1 of the first row to the row clock signal Rm of the m-th row, the enabling time length of each of the $(2^X-1+Y)$ sub-frames of the p-th frame can include the same enabling time offset or different enabling time offsets, but not limited to this. In addition, the Y sub-frames corresponding to Y bits (that is, the $2^X$ sub-frame to the $(2^X-1+Y)$ sub-frame) can also be uniformly interlaced in the $(2^X-1)$ sub-frames corresponding to X bits. (that is, the first frame to the $(2^X-1)$ second frame), but not limited to this.

Figure 28A:
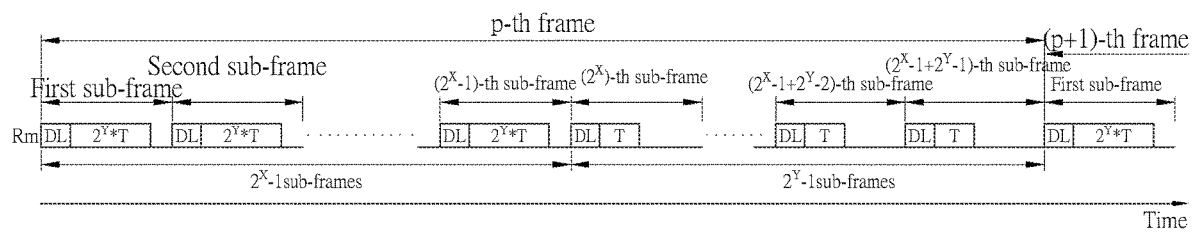
FIG. 28A illustrates a timing diagram of the m-th row clock signal Rm when the separate distributed PWM method is adopted for the p-th frame.

In addition, as shown in FIG. 28A, if the p-th frame includes (X+Y) bits, the p-th frame can also adopt a separate distributed PWM method. For the row clock signal Rm of the m-th row, the X bits and Y bits in the (X+Y) bits of the p-th frame can separately use the distributed PWM method, then the p-th frame includes $(2^X-1)+(2^Y-1)$ sub-frames, of which $(2^X-1)$ sub-frames corresponding to X bits, that is, the first sub-frame to the $(2^X-1)$ sub-frame having the enabling time length of $(2^Y*T)$, and the $(2^X-1)$ sub-frames corresponding to Y bits; that is, the $2^X$ sub-frame to the $(2^X-1+2^Y-1)$ sub-frame having the same enabling time length of T, but not limited to this. In other words, in the p-th frame, the X-bit and Y-bit separately using the distributed PWM method can have different enabling time lengths, but not limited to this.

It should be noted that for the row clock signal Rm of the m-th row, the enabling time length of each of the $(2^X-1)+(2^Y-1)$ sub-frames included in the p-th frame can include the same enabling time offset or different enabling time offsets, but not limited to this. In addition, the $(2^Y-1)$ sub-frames corresponding to the Y bit (that is, the $2^X$ sub-frame to the $(2^X-1+2^Y-1)$ sub-frame) can be uniformly interlaced in the $(2^X-1)$ sub-frames (that is, the first frame to the (2X−1) sub-frame) corresponding to the X bit, but not limited to this.

Figure 28B:
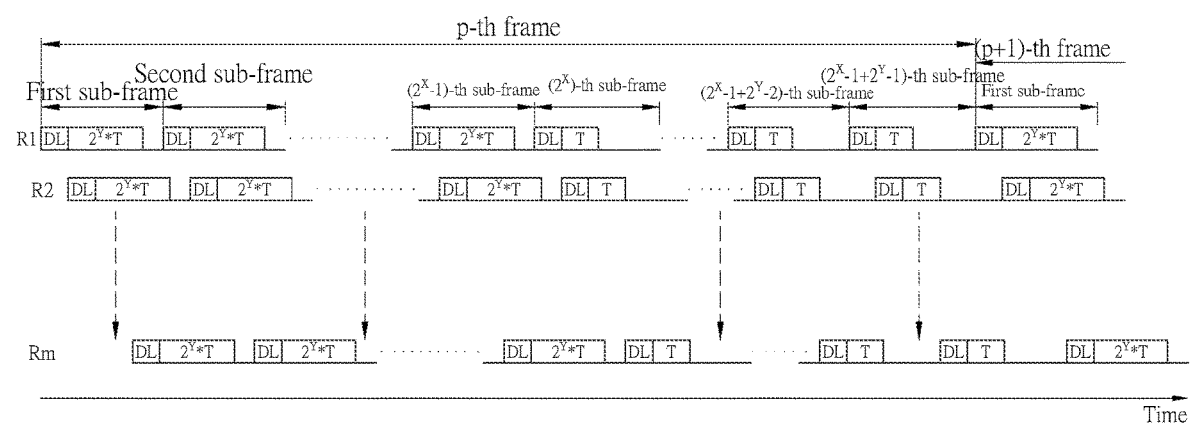
FIG. 28B illustrates a timing diagram of the first row clock signal R1 to the m-th row clock signal Rm when the separate distributed PWM method is adopted for the p-th frame.

Continuing, as shown in FIG. 28B, for the row clock signal R1 of the first row to the row clock signal Rm of the m-th row, the enabling time lengths of the first frame to the $(2^X-1)$-th frames are all $(2^Y*T)$ and the enabling time lengths of the 2X frame to the $(2^X-1+2^Y-1)$ frames are all T, and the start times of the row clock signal R1 of the first row to the row clock signal Rm to the m-th row will sequentially become later, but not limited to this.

It should be noted that, for each of the row clock signal R1 of the first row to the row clock signal Rm of the m-th row, each of the $(2^X-1)+(2^Y-1)$ included in the p-th frame having the enabling time length including the same or different enabling time offsets, but not limited to this. In addition, the $(2^Y-1)$ sub-frames corresponding to the Y bit (that is, the 2-th sub-frame to the $(2^X-1+2^Y-1)$-th sub-frame) can be uniformly interlaced in the $(2^X-1)$ sub-frames (that is, the first sub-frame to the $(2^X-1)$-th sub-frame) corresponding to the X bit, but not limited to this.

Compared with the prior art, the micro-LED IC of the invention adopts a distributed and binary mixed PWM method to achieve the following advantages and effects: (1) Low speed and low power consumption; (2) high frame rate; (3) high pixel resolution; and (4) reduce the number of pins, but not limited to this.

Figure 29:
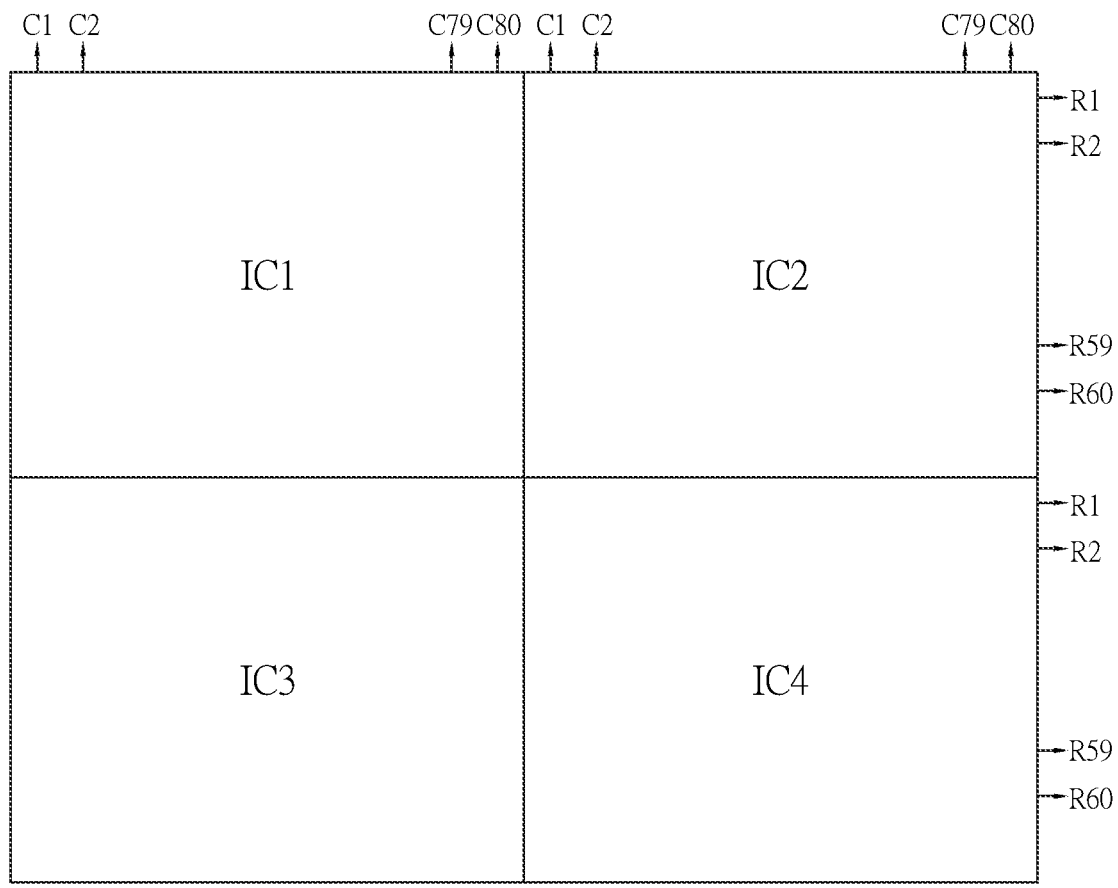
FIG. 29 and FIG. 30 illustrate schematic diagrams of the μICs arranged in a matrix receiving column data signals and row clock signals outputted by the first row/column driver to the fourth row/column driver respectively.
Figure 30:
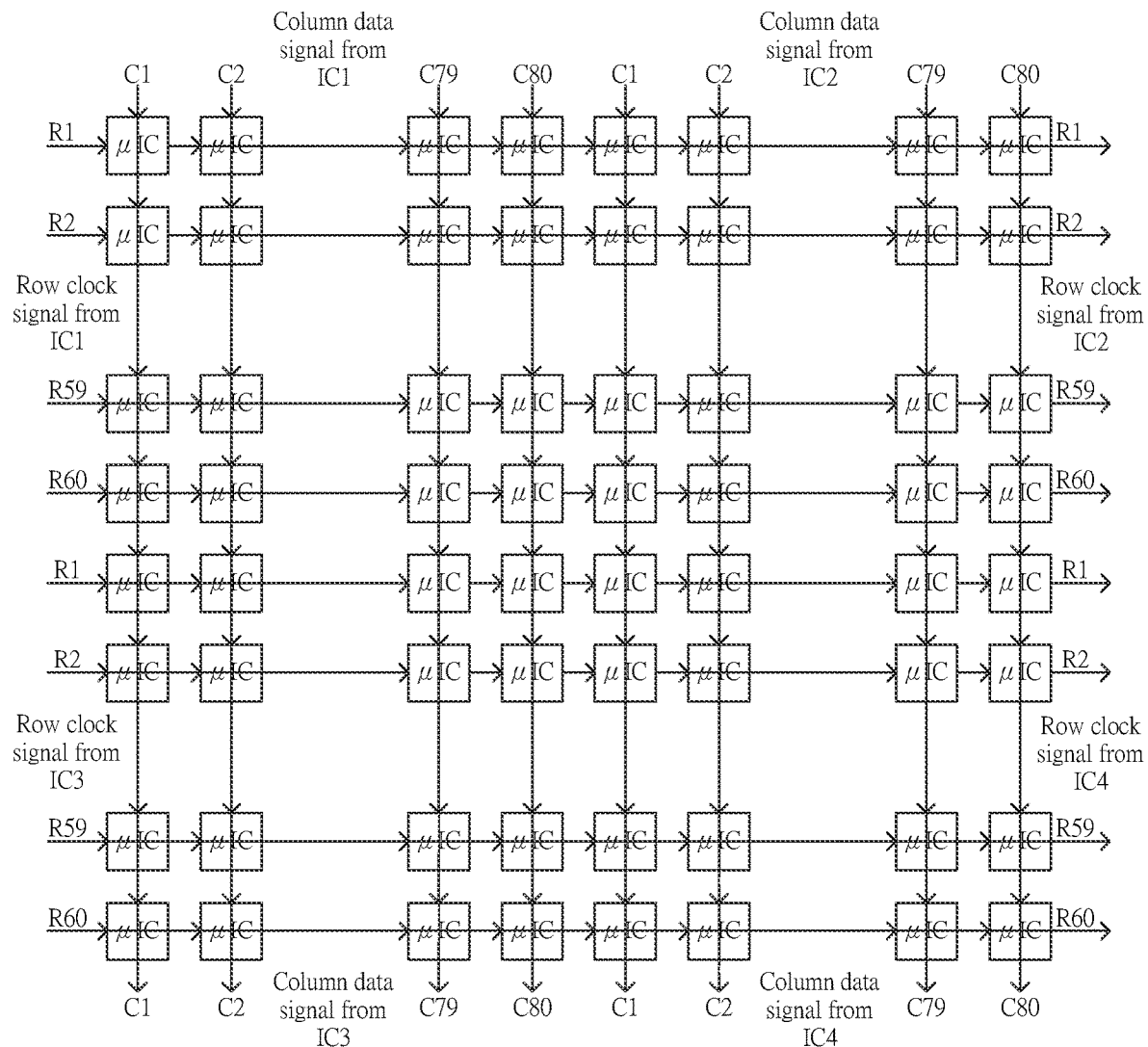

Please refer to FIG. 29 and FIG. 30, if there are (4*80*60) μICs arranged in a matrix, and the first row/column driver IC1 to the four row/column driver IC4 output column data signals C1~C80 and row clock signals R1~R60 respectively. For the (80*60) μICs arranged in the upper left corner of FIG. 30, its 80-row μICs respectively receive column data signals C1~C80 from the first row/column driver IC1 and its 60-row μICs respectively receive row clock signals R1~R60 from the first row/column driver IC1.

It should be noted that each μIC in the same column (such as the first column) needs to receive the corresponding column data signal C1 and each μIC in the same row (For example, the first row) needs to receive the corresponding row clock signal R1.

Similarly, for the (80*60) μICs arranged in the upper right corner of FIG. 30, the 80 columns of μICs respectively receive the column data signals C1~C80 from the second row/column driver IC2 and its 60-row µIC respectively receive the row clock signals R1~R60 from the second row/column driver IC2.

Similarly, for the (80*60) µICs arranged in the lower left corner of FIG. 30, the 80 columns of µICs are respectively receive the column data signals C1~C80 from the third row/column driver IC3 and its 60-row µIC respectively receive the row clock signals R1~R60 from the third row/column driver IC3.

Similarly, for the (80*60) µICs arranged in the lower right corner of FIG. 30, the 80 columns of µICs are respectively receive the column data signals C1~C80 from the fourth row/column driver IC4 and its 60-row µIC respectively receive the row clock signals R1~R60 from the fourth row/column driver IC4.

Figure 31:
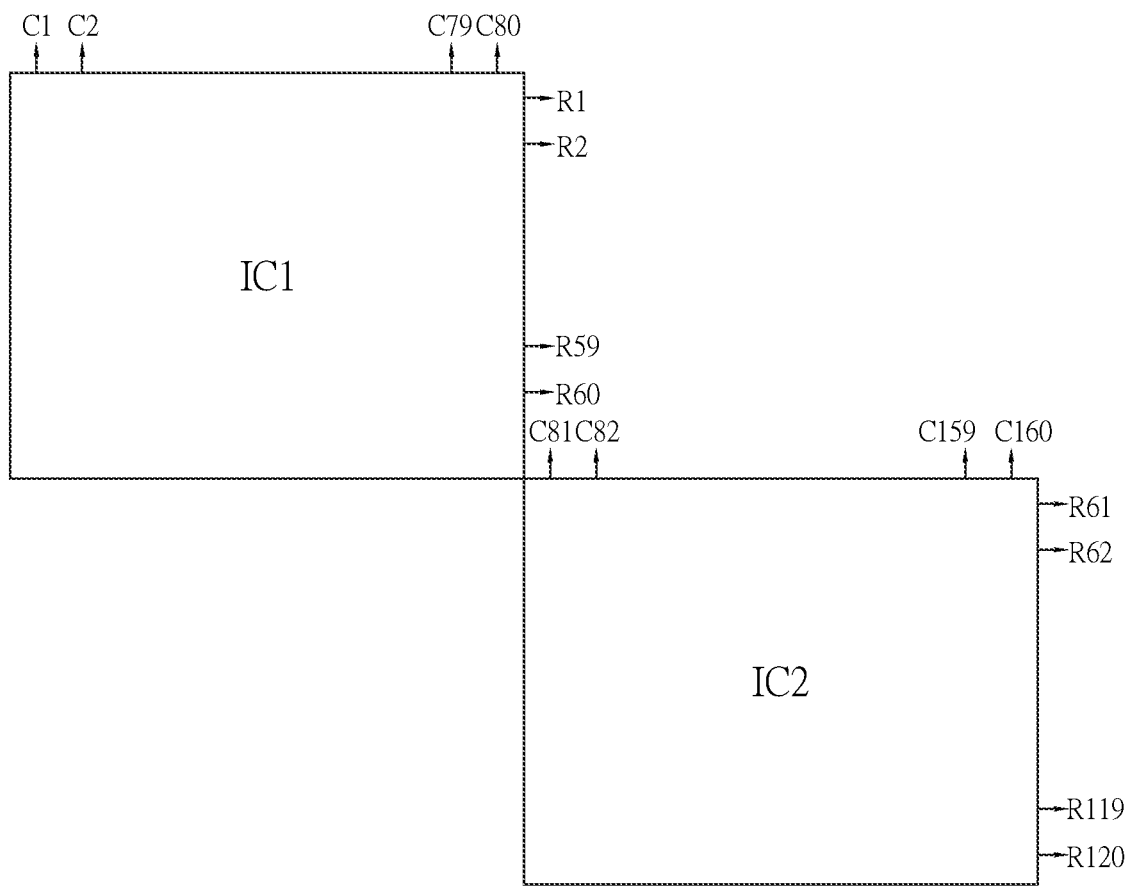
FIG. 31 and FIG. 32 illustrate schematic diagrams of the μICs having columns and rows sequentially cascaded receiving column data signals and row clock signals outputted by the first row/column driver to the second row/column driver respectively.
Figure 32:
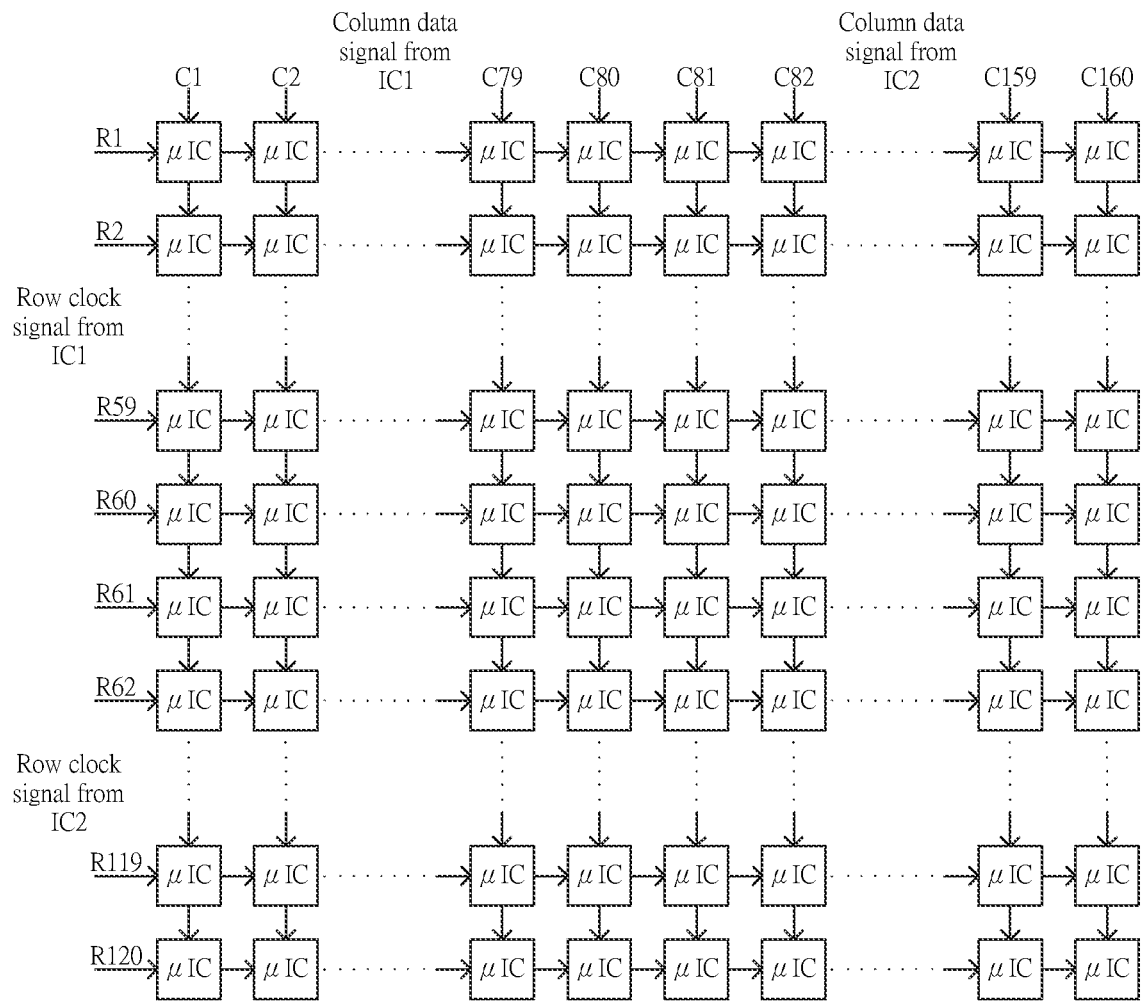

Please refer to FIG. 31 and FIG. 32, assuming that there are (160*120) µICs in FIG. 32, including 160 columns of µICs and 120 rows of µICs, in which 120 µICs in each column are cascaded and 160 µICs in each row are cascaded.

The first row/column driver IC in FIG. 31 outputs column data signals C1~C80 and row clock signals R1~R60 respectively, and the second row/column driver IC2 outputs column data signals C81~C160 and row clock signals R61~R120 respectively. The 160-column cascaded µICs in FIG. 32 sequentially receives the column data signals C1~C80 from the first row/column driver IC1 and the column data signals C81~C160 from the second row/column driver IC2. In FIG. 32, the 120-row cascaded µICs sequentially receives the row clock signals R1~R60 from the first row/column driver IC1 and the row clock signals R61~R120 from the second row/column driver IC2.

It should be noted that, compared with the µICs in the matrix arrangement in FIG. 30, each µIC in the same column (for example, the first column) needs to receive the column data signal C1 separately, and each µIC in the same row (for example, the first row) needs to receive the row clock signal R1 separately, the same column of µICs (for example, the first column) and the same row of µICs (for example, the first row) in FIG. 32 adopt the cascade coupling method to effective reduce the number of row/column drivers required by the micro-LED display system and the number of pins required by each µIC, but not limited to this.

Compared to the prior art, the µIC of the Micro-LED display system of the invention can achieve the following effects: (1) low speed and low power consumption; (2) high frame rate; (3) high pixel resolution; (4) reducing required number of pins; and (5) reducing required number of column/row drivers.

What is claimed is:
1. A micro-LED display system, comprising:
a host;
a plurality of row/column drivers, coupled to the host through serial interfaces and configured to provide a plurality of row clock signals and a plurality of column data signals respectively; and
a plurality of micro-LED integrated circuits (µICs), arranged as a matrix comprising a plurality of columns of µICs and a plurality of rows of the plurality of columns of µICs receiving the plurality of column data signals respectively and the plurality of rows of µICs receiving the plurality of row clock signals respectively, wherein all µICs in the same column are cascaded in order and all µICs in the same row are cascaded in order, the µIC receives the column data signal, the row clock signal and a LED enable signal respectively, the µIC comprises:

a first D-type flip-flop to a fifth D-type flip-flop;
a first ADD gate to a third ADD gate; and
a first transistor to a sixth transistor;
wherein an input terminal of the first D-type flip-flop receives the column data signal and its output terminal is coupled to an input terminal of the second D-type flip-flop, and an output terminal of the second D-type flip-flop is coupled to an input terminal of the third D-type flip-flop, an output terminal of the third D-type flip-flop is coupled to an input terminal of the fourth D-type flip-flop, the other input terminals of the first D-type flip-flop to the fourth D-type flip-flop receive the row clock signal, an input terminal of the fifth D-type flip-flop receives the LED enable signal and the other input terminal of the fifth D-type flip-flop is coupled to an output terminal of the fourth D-type flip-flop, an output terminal of the fifth D-type flip-flop is coupled to a bias voltage, an input terminal of the first AND gate receives the LED enable signal and the other input terminal of the first AND gate is coupled between the first D-type flip-flop and the second D-type flip-flop, an input terminal of the second AND gate receives the LED enable signal and the other input terminal of the second AND gate is coupled between the second D-type flip-flop and the third D-type flip-flop, an input terminal of the third AND gate receives the LED enable signal and the other input terminal of the third AND gate is coupled between the third D-type flip-flop and the fourth D-type flip-flop, the output terminals of the first AND gate to the third AND gate output a first control signal, a second control signal and a third control signal respectively, the first transistor and the second transistor are coupled in series between a red micro-LED and a ground terminal, the first transistor is controlled by the first control signal and the second transistor is controlled by the bias voltage, the third transistor and the fourth transistor are coupled in series between a green micro-LED and the ground terminal, the third transistor is controlled by the second control signal and the fourth transistor is controlled by the bias voltage, the fifth transistor and the sixth transistor are coupled in series between a blue micro-LED and the ground terminal, and the fifth transistor is controlled by the third control signal and the sixth transistor is controlled by the bias voltage.

2. The micro-LED display system of claim 1, wherein the LED enable signal has an LED turn-on enable period, a pulse width of the column data signal is greater than a pulse width of the row clock signal, a rising edge of the column data signal is earlier than a rising edge of the row clock signal, and a falling edge of the column data signal and a falling edge of the row clock signal are synchronized with each other.

3. A micro-LED display system, comprising:
a host;
a plurality of row/column drivers, coupled to the host through serial interfaces and configured to provide a plurality of row clock signals and a plurality of column data signals respectively; and
a plurality of micro-LED integrated circuits (µICs), arranged as a matrix comprising a plurality of columns of µICs and a plurality of rows of the plurality of columns of µICs receiving the plurality of column data signals respectively and the plurality of rows of µICs receiving the plurality of row clock signals respectively, wherein all µICs in the same column are cascaded in order and all µICs in the same row are cascaded in order, wherein the µIC receives the column data signal and the row clock signal respectively, the µIC comprises:
a first D-type flip-flop to a fifth D-type flip-flop;
a first ADD gate to a third ADD gate;
a LED enabling unit; and
a first transistor to a sixth transistor;
wherein an input terminal of the first D-type flip-flop receives the column data signal and its output terminal is coupled to an input terminal of the second D-type flip-flop, and an output terminal of the second D-type flip-flop is coupled to an input terminal of the third D-type flip-flop, an output terminal of the third D-type flip-flop is coupled to an input terminal of the fourth D-type flip-flop, the other input terminals of the first D-type flip-flop to the fourth D-type flip-flop receive the row clock signal, and an input terminal of the fifth D-type flip-flop is coupled to the LED turn-on enabling unit and receives an enable signal, the other input terminal of the fifth D-type flip-flop is coupled to an output terminal of the fourth D-type flip-flop, an output terminal of the fifth D-type flip-flop is coupled to a bias voltage, and an input terminal of the first AND gate is coupled to the LED turn on enabling unit and receives the enable signal, and its other input terminal is coupled between the first D-type flip-flop and the second D-type flip-flop, and an input terminal of the second AND gate is coupled to the LED turn on enabling unit and receives the enable signal, and its other input terminal is coupled between the second D-type flip-flop and the third D-type flip-flop, an input terminal of the third AND gate is coupled to the LED turn-on enabling unit and receives the enable signal, and its other input terminal is coupled between the third D-type flip-flop and the fourth D-type flip-flop, output terminals of the first AND gate to the third AND gate output a first control signal, a second control signal and a third control signal respectively, the first transistor and the second transistor are coupled in series between a red micro-LED and a ground terminal, the first transistor is controlled by the first control signal and the second transistor is controlled by the bias voltage, and the third transistor and the fourth transistor are coupled in series between a green micro-LED and the ground terminal, the third transistor is controlled by the second control signal and the fourth transistor is controlled by the bias voltage, the fifth transistor and the sixth transistor are coupled in series between a blue micro-LED and the ground terminal, the fifth transistor is controlled by the third control signal and the sixth transistor is controlled by the bias voltage.

4. The micro-LED display system of claim 3, wherein a pulse width of the column data signal is greater than a pulse width of the row clock signal, a rising edge of the column data signal is earlier than a rising edge of the row clock signal, and a falling edge of the column data signal and a falling edge of the row clock signal are synchronized with each other, the row clock signal is embedded with an LED turn-on enable period.

5. A micro-LED display system, comprising:
a host;
a plurality of row/column drivers, coupled to the host through serial interfaces and configured to provide a plurality of row clock signals and a plurality of column data signals respectively; and
a plurality of micro-LED integrated circuits (µICs), arranged as a matrix comprising a plurality of columns of µICs and a plurality of rows of the plurality of columns of µICs receiving the plurality of column data signals respectively and the plurality of rows of µICs receiving the plurality of row clock signals respectively, wherein all µICs in the same column are cascaded in order and all µICs in the same row are cascaded in order, wherein the µIC receives the column data signal and the row clock signal respectively, the µIC comprises:
a first D-type flip-flop to a fifth D-type flip-flop;
a first ADD gate to a third ADD gate;
a LED turn on enabling and DFF reset unit; and
a first transistor to a sixth transistor;
wherein an input terminal of the first D-type flip-flop receives the column data signal and its output terminal is coupled to an input terminal of the second D-type flip-flop, and an output terminal of the second D-type flip-flop is coupled to an input terminal of the third D-type flip-flop, an output terminal of the third D-type flip-flop is coupled to an input terminal of the fourth D-type flip-flop, the LED turn on enabling and DFF reset unit and the other input terminals of the first D-type flip-flop to the fourth D-type flip-flop all receive the row clock signal, and an input terminal of the fifth D-type flip-flop is coupled to the LED turn on enabling and DFF reset unit to receive an enable signal and the other input terminal of the fifth D-type flip-flop is coupled to an output terminal of the fourth D-type flip-flop, and an output terminal of the fifth D-type flip-flop is coupled to a bias voltage, an input terminal of the first AND gate is coupled to the LED turn on enabling and DFF reset unit to receive the enable signal, and the other input terminal of the first AND gate is coupled between the first D-type flip-flop and the second D-type flip-flop, an input terminal of the second AND gate is coupled to the LED turn on enabling and DFF reset unit to receive the enable signal, and the other input terminal of the second AND gate is coupled between the second D-type flip-flop and the third D-type flip-flop, an input terminal of the third AND gate is coupled to the LED turn on enabling and DFF reset unit to receive the enable signal and the other input terminal of the third AND gate is coupled between the third D-type flip-flop and the fourth D-type flip-flop, output terminals of the first AND gate to the third AND gate output a first control signal, a second control signal and a third control signal respectively, the LED turn on enabling and DFF reset unit is respectively coupled to and provides a reset signal to the other input terminals of the first D-type flip-flop to the fourth D-type flip-flop, the first transistor and the second transistor are coupled in series between a red micro-LED and a ground terminal, the first transistor is controlled by the first control signal and the second transistor is controlled by the bias voltage, the third transistor and the fourth transistor are coupled in series between a green micro-LED and the ground terminal, and the third transistor is controlled by the second control signal and the fourth transistor is controlled by the bias voltage, the fifth transistor and the sixth transistor are coupled in series between a blue micro-LED and the ground terminal, the fifth transistor is controlled by the third control signal and the sixth transistor is controlled by the bias voltage.

6. The micro-LED display system of claim 5, wherein a pulse width of the column data signal is greater than a pulse width of the row clock signal, a rising edge of the column data signal is earlier than a rising edge of the row clock signal, and a falling edge of the column data signal and a falling edge of the row clock signal are synchronized with each other, and the row clock signal is also embedded with an LED turn-on enable period, a falling edge of the reset signal is synchronized with a rising edge of the row clock signal and a rising edge of the reset signal is synchronized with an end time of the LED turn-on enable period and a falling edge of the enable signal.

7. The micro-LED display system of claim 1, wherein the µIC receives the column data signal, the row clock signal, a latch enable signal, and an output reset signal respectively, the µIC comprises a first D-type flip-flop to an eighth D-type flip-flop and a first ADD gate to a third ADD gate, an input terminal of the first D-type flip-flop receives the column data signal and its output terminal is coupled to an input terminal of the second D-type flip-flop, an output terminal of the second D-type flip-flop is coupled to an input terminal of the third D-type flip-flop, and an output terminal of the third D-type flip-flop is coupled to an input terminal of the fourth D-type flip-flop, other input terminals of the first D-type flip-flop to the fourth D-type flip-flop all receive the row clock signal, an input terminal of the fifth D-type flip-flop receives the latch enable signal and the other input terminal of the fifth D-type flip-flop is coupled between the first D-type flip-flop and the second D-type flip-flop, an input terminal of the sixth D-type flip-flop receives the latch enable signal and the other input terminal of the sixth D-type flip-flop is coupled between the second D-type flip-flop and the third D-type flip-flop, an input terminal of the seventh D-type flip-flop receives the latch enable signal and the other input terminal of the seventh D-type flip-flop is coupled between the third D-type flip-flop and the fourth D-type flip-flop, an input terminal of the eighth D-type flip-flop receives the latch enable signal and the other input terminal of the eighth D-type flip-flop is coupled to an output terminal of the fourth D-type flip-flop, an input terminal of the first ADD gate receives the output reset signal and the other input terminal of the first ADD gate is coupled to an output terminal of the fifth D-type flip-flop, an input terminal of the second ADD gate receives the output reset signal and the other input terminal of the second ADD gate is coupled to an output terminal of the sixth D-type flip-flop, an input terminal of the third ADD gate receives the output reset signal and the other input terminal of the third ADD gate is coupled to an output terminal of the seventh D-type flip-flop, output terminals of the first ADD gate to the third ADD gate output a first control signal, a second control signal and a third control signal respectively, and an output terminal of the eighth D-type flip-flop outputs a fourth control signal.

8. The micro-LED display system of claim 7, wherein when the µIC is operated in an all-on mode, the latch enable signal changes from low-level to high-level at a time when the column data signal enters a blanking interval, and then both the row clock signal and the latch enable signal maintain high-level until the row data signal ends at another time when the blanking interval is synchronized from high-level to low-level, and a rising edge of the output reset signal and a rising edge of the row clock signal are synchronized and maintained at high-level, and a start time and an end time of a sub-frame are synchronized with a rising edge of the latch enable signal.

9. The micro-LED display system of claim 7, wherein when the µIC is operated in a pulse-width modulation (PWM) mode, the latch enable signal changes from low-level to high-level at a time when the column data signal enters a blanking interval, and the row clock signal and the latch enable signal are synchronously changed from high-level to low-level at another time in the blanking interval of the column data signal, and a rising edge of the output reset signal and a rising edge of the row clock signal are synchronized and maintained at high-level, and the output reset signal becomes low-level at another time in the blanking interval of the column data signal, and a start time and an end time of a sub-frame are both synchronized with a rising edge of the latch enable signal.

10. The micro-LED display system of claim 1, further comprising a pulse filter, the pulse filter comprises a NOT gate, a current source and a transistor, the current source and the transistor are coupled in series with each other and the NOT gate is coupled to a gate of the transistor, the NOT gate is coupled to the row clock signal and a DFF reset signal or an enable signal is coupled between the current source and the transistor to filter the DFF reset signal or the enable signal.

11. The micro-LED display system of claim 1, wherein for a bit, the plurality of column data signals is the same to sequentially transmit different data pulses at the same time, while the plurality of row clock signals is different to sequentially transmit clock pulses at different times.

12. The micro-LED display system of claim 1, wherein the row/column driver comprises a row driver, a column driver, a word line decoder, a frame buffer, a clock buffer, a data arranging unit, a serial protocol interface, a protocol decoder and a register, the protocol decoder is coupled between the serial protocol interface and the register, the data arranging unit is coupled between the protocol decoder and the frame buffer, and the word line decoder is coupled among the clock buffer, the row driver and the frame buffer, the frame buffer is coupled among the word line decoder, the data arranging unit and the row driver, the serial protocol interface receives a serial clock signal and a serial data and control signal respectively, the clock buffer receives the serial clock signal and converts the serial clock signal into a gray-scale clock signal and outputs the gray-scale clock signal to the word line decoder, the row driver outputs the plurality of row clock signals and the column driver outputs the plurality of column data signals respectively.

13. The micro-LED display system of claim 1, wherein the row/column driver comprises a row driver, a column driver, a word line decoder, a frame buffer, a phase-locked loop, a data arranging unit, a serial protocol interface, a protocol decoder and a register, the protocol decoder is coupled between the serial protocol interface and the register, the data arranging unit is coupled between the protocol decoder and the frame buffer, and the word line decoder is coupled among the phase-locked loop, the row driver and the frame buffer, the frame buffer is coupled among the word line decoder, the data arranging unit and the row driver, the serial protocol interface receives a serial clock signal and a serial data and control signal respectively, the phase-locked loop receives the serial clock signal and converts the serial clock signal into a gray-scale clock signal and outputs the gray-scale clock signal to the word line decoder, the row driver outputs the plurality of row clock signals and the column driver outputs the plurality of column data signals respectively.

14. The micro-LED display system of claim 1, wherein the row/column driver comprises a row driver, a column driver, a word line decoder, a frame buffer, an oscillator and one-time programmable, a data arranging unit, a serial protocol interface, a protocol decoder and a register, the protocol decoder is coupled between the serial protocol interface and the register, the data arranging unit is coupled between the protocol decoder and the frame buffer, and the word line decoder is coupled among the oscillator and one-time programmable, the row driver and the frame buffer, the frame buffer is coupled among the word line decoder, the data arranging unit and the row driver, the serial protocol interface receives a serial clock signal and a serial data and control signal respectively, the oscillator and one-time programmable receives the serial clock signal and converts the serial clock signal into a gray-scale clock signal and outputs the gray-scale clock signal to the word line decoder, the row driver outputs the plurality of row clock signals and the column driver outputs the plurality of column data signals respectively.

15. The micro-LED display system of claim 12, wherein the row/column driver also comprises a data correction and mapping unit, the data correction and mapping unit is coupled between the protocol decoder and the data arranging unit and configured to perform data correction and mapping process before data arrangement.

16. The micro-LED display system of claim 1, wherein if a binary PWM method is adopted, a p-th frame of n-bits comprises n sub-frames in order, which are a (n−1)-th sub-frame and a (n−2)-th sub-frame, . . . , a first frame and a zeroth frame, the (n−1)-th subframe has a most significant bit and the zeroth frame has a least significant bit, for each of the plurality of row clock signals, if an enable time length that it corresponds to the zeroth frame is T, then an enable time length that it corresponds to the (n−1)-th frame is $(2^{n-1}*T)$, an enable time length that it corresponds to the (n−2)-th frame is $(2^{n-2}*T)$, . . . and an enable time length that it corresponds to the first frame is (2*T), where n and p are both positive integers, and an enable time length that it corresponds to each frame can comprise the same enable time offset or different enable time offsets.

17. The micro-LED display system of claim 1, wherein if a distributed PWM method is adopted, a p-th frame of n-bits comprises (2n−1) sub-frames, which are sequentially a first frame, a second frame, . . . , a $(2^{n-1})$-th sub-frame and a $(2^n-1)$-th sub-frame, for each of the plurality of row clock signals, an enable time length that it corresponds to each frame can be the same or different and the enable time length that it corresponds to each frame can comprise the same enable time offset or different enable time offsets.

18. The micro-LED display system of claim 1, wherein if a p-th frame comprises (X+Y) bits, X and Y are both positive integers, and when a distributed and binary mixed PWM method is adopted for the p-th frame, a distributed PWM method is adopted for X bits in the (X+Y) bits of the p-th frame and a binary PWM method is adopted for Y bits in the (X+Y) bits of the p-th frame, then the p-th frame comprises $(2^X-1)$ sub-frames corresponding to the X bits and Y sub-frames corresponding to the Y bits, for each of the plurality of row clock signals, enable time lengths it corresponds to the $(2^X-1)$ sub-frames using the distributed PWM method are all $(2^Y*T)$ and enable time lengths it corresponds to the Y sub-frames using the binary PWM method are (2Y* T/2), . . . , $2^1*T$, $2^0*T$ respectively, for each of the plurality of row clock signals, each of the $(2^X-1)+Y$ sub-frames of the p-th frame can have the same enable time offset or different enable time offsets, and the Y sub-frames corresponding to the Y bits can be uniformly interlaced among the $(2^X-1)$ sub-frames corresponding to the X bits; when a separate distributed PWM method is adopted for the p-th frame, the separate distributed PWM method is separately adopted for the X bits and the Y bits of the (X+Y) bit respectively, then the p-th frame includes $(2^X-1)$ sub-frames corresponding to the X bits and $(2^Y-1)$ sub-frames corresponding to the Y bits, for each of the plurality of row clock signals, enable time lengths of the $(2^X-1)$ sub-frames are all $(2^Y*T)$ and enabling time lengths of the $(2^Y-1)$ sub-frames are all T, for each of the plurality of row clock signals, each of the $(2^X-1)+(2^Y-1)$ sub-frames of the p-th frame can have the same enable time offset or different enable time offsets, and the $(2^Y-1)$ sub-frames corresponding to the Y bits can be uniformly interlaced among the $(2^X-1)$ sub-frames corresponding to the X bits.

19. The micro-LED display system of claim 1, wherein since all μICs in the same column of μICs are cascaded in order, when one of the μICs in the same column of μICs receives a corresponding column data signal, the column data signal is forwarded to the next μIC in the same column of μICs and so on, and the column data signal is transmitted to the last μITC in the same column of μICs; since all μICs in the same row of μICs are cascaded in order, when one of the μICs in the same row of μICs receives a corresponding row clock signal, the row clock signal is forwarded to the next μIC in the same row of μICs and so on, and the row clock signal is transmitted to the last μIC in the same row of μICs, thereby reducing a number of the row/column drivers and a number of pins required for each μIC needed for the micro-LED display system.

* * * * *